(12) United States Patent
Vasanawala et al.

(10) Patent No.: US 6,307,368 B1
(45) Date of Patent: Oct. 23, 2001

(54) LINEAR COMBINATION STEADY-STATE FREE PRECESSION MRI

(75) Inventors: Shreyas S. Vasanawala, Mountain View; John M. Pauly, Redwood City; Dwight G. Nishimura, Palo Alto, all of CA (US)

(73) Assignee: Board of Trustees of the Leland Stanford Junior University, Palo Alto, CA (US)

(*) Notice: Subject to any disclaimer, the term of this patent is extended or adjusted under 35 U.S.C. 154(b) by 0 days.

(21) Appl. No.: 09/312,025

(22) Filed: May 14, 1999

(51) Int. Cl.⁷ ........................................ G01V 3/00
(52) U.S. Cl. ................ 324/309; 324/311; 324/307; 324/300
(58) Field of Search .................... 324/309, 307, 324/311, 300

(56) References Cited

U.S. PATENT DOCUMENTS

| | | | |
|---|---|---|---|
| 3,824,452 | * 7/1974 | Freeman | 324/5 R |
| 4,999,580 | * 3/1991 | Meyer et al. | 324/309 |
| 5,187,369 | * 2/1993 | Takane et al. | 324/306 |
| 5,256,967 | * 10/1993 | Foo et al. | 324/311 |
| 5,347,216 | * 9/1994 | Foo et al. | 324/300 |

OTHER PUBLICATIONS

Zur et al. Motion Insensitive Steady State Free Precession Imaging, Magn. Reson. Med., vol. 16, pp 444–459 (1990).*

* cited by examiner

*Primary Examiner*—Christine Oda
*Assistant Examiner*—Brij B. Shrivastav
(74) *Attorney, Agent, or Firm*—Townsend and Townsend and Crew LLP; Henry K. Woodward

(57) ABSTRACT

A fast, spectrally-selective steady-state free precession (SSFP) imaging method is presented. Combining k-space data from SSFP sequences with certain phase schedules of radiofrequency excitation pulses permits manipulation of the spectral selectivity of the image. For example, lipid and water can be rapidly resolved. The contrast of each image depends on both $T_1$ and $T_2$, and the relative contribution of the two relaxation mechanisms to image contrast can be controlled by adjusting the flip angle. Several applications of the technique are presented, including fast musculoskeletal imaging, brain imaging, and angiography. The technique is referred to herein as linear combination steady-state free precession (LCSSFP) and fluctuating equilibrium magnetic resonance (FEMR).

41 Claims, 22 Drawing Sheets

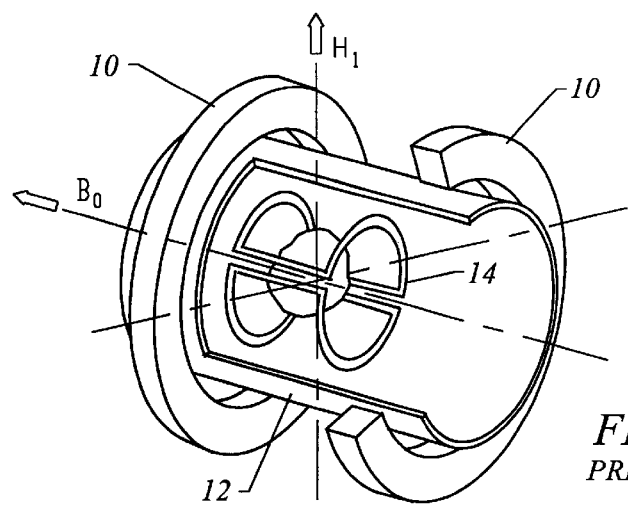
FIG. 1A
*PRIOR ART*
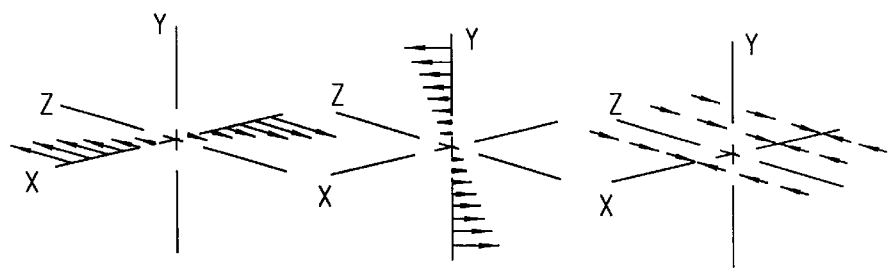
FIG. 1B
*PRIOR ART*
FIG. 1C
*PRIOR ART*
FIG. 1D
*PRIOR ART*
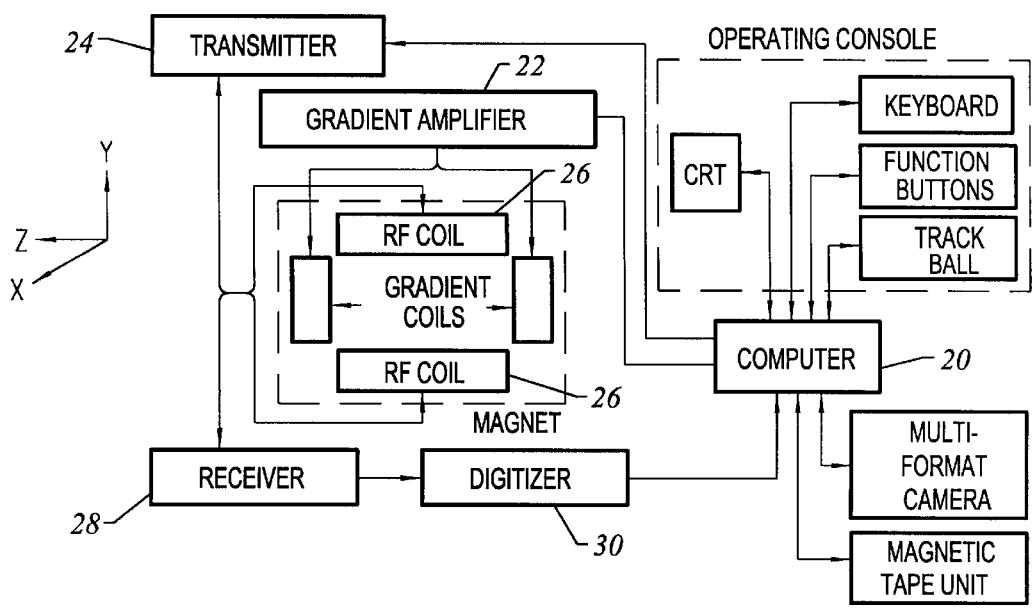
FIG. 2
*PRIOR ART*

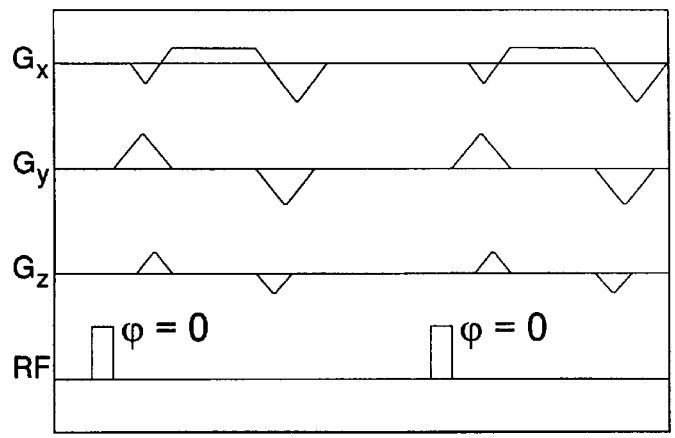
FIG. 3
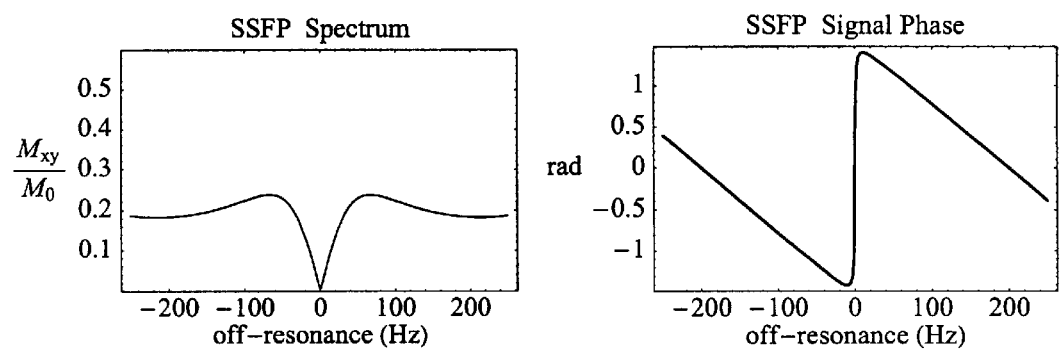
FIG. 4A                    FIG. 4B

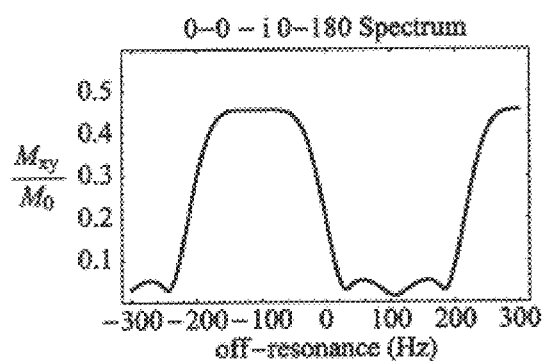
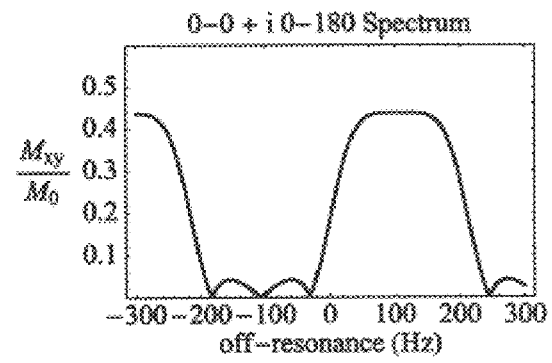
*FIG. 8A*  *FIG. 8B*
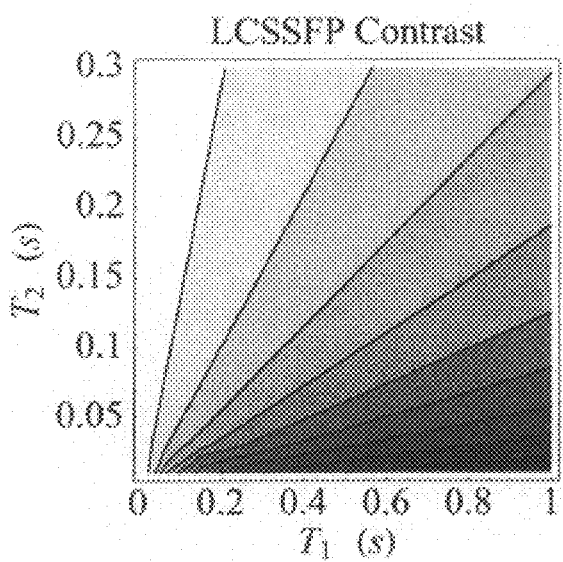
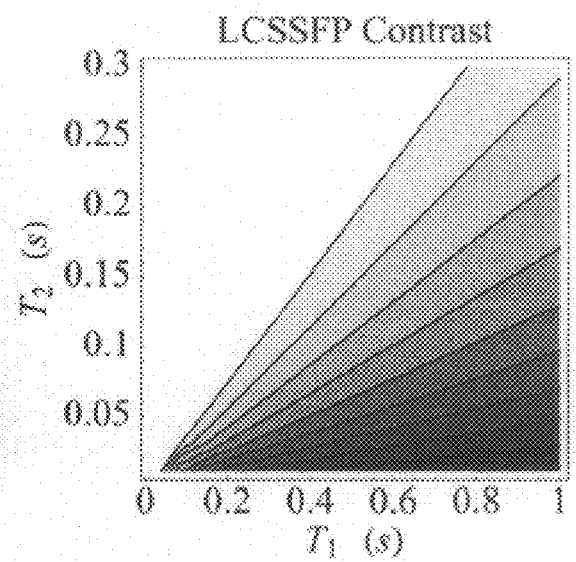
*FIG. 9A*  *FIG. 9B*

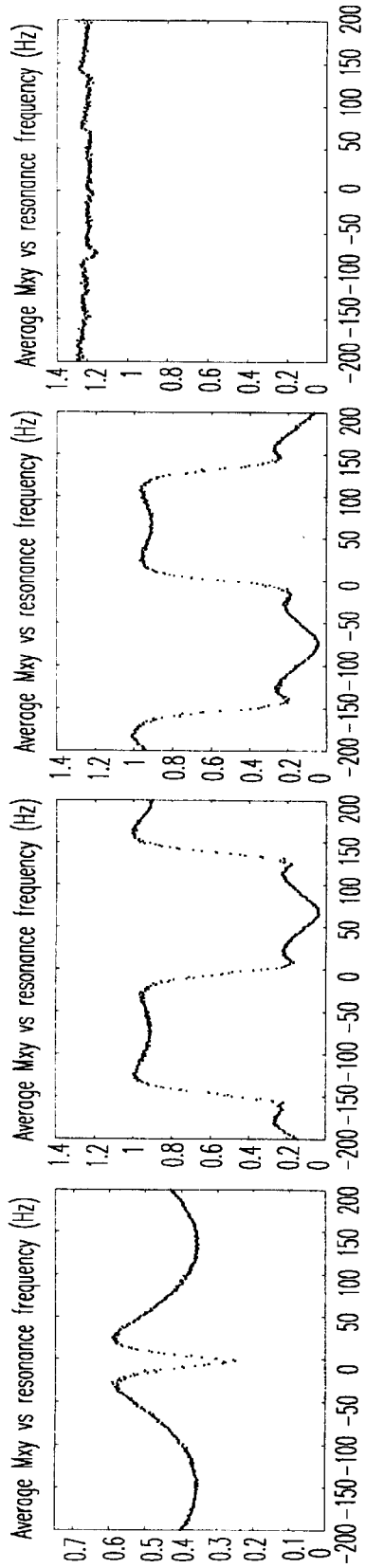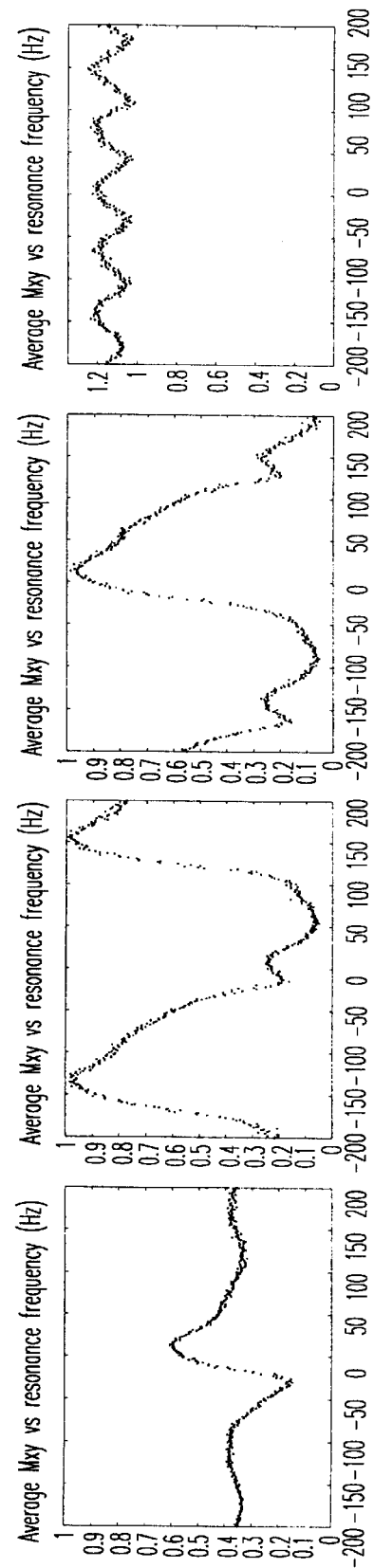

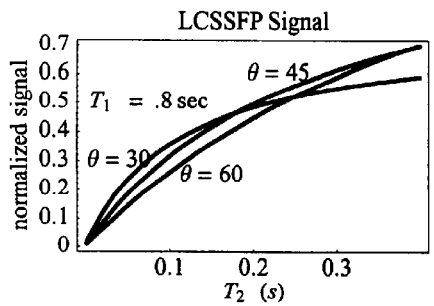
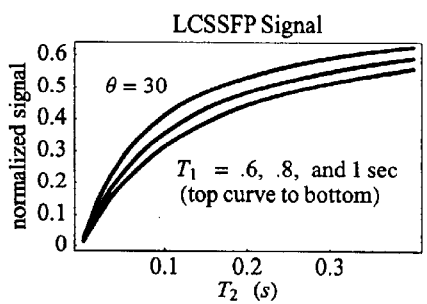
*FIG. 15A*  *FIG. 15B*
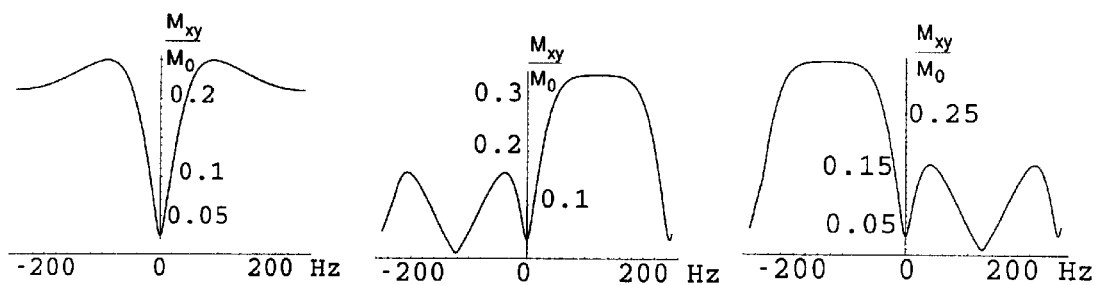
*FIG. 16A*  *FIG. 16B*  *FIG. 16C*

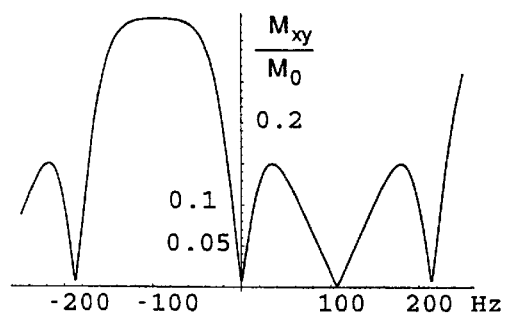
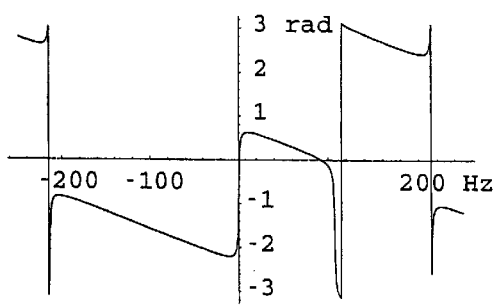
*FIG. 17A*   *FIG. 17B*
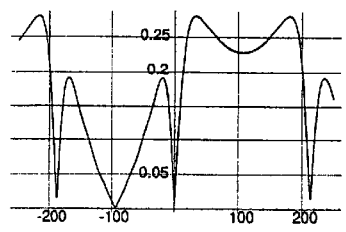
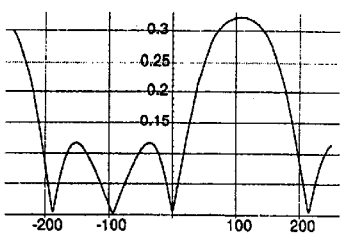
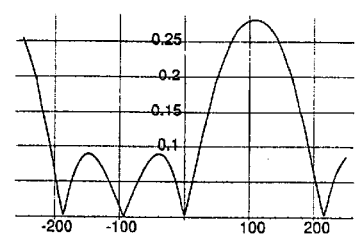
*FIG. 18A*   *FIG. 18B*   *FIG. 18C*

FIG. 20A
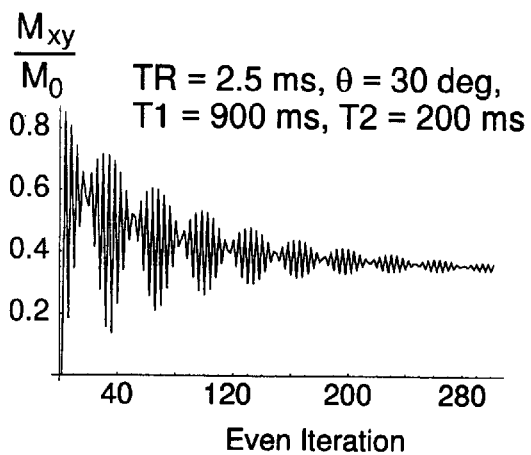
FIG. 20C
FIG. 20B
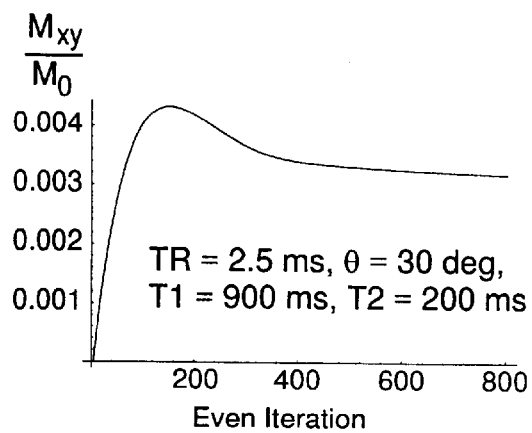
FIG. 20D

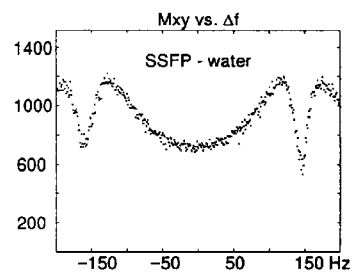 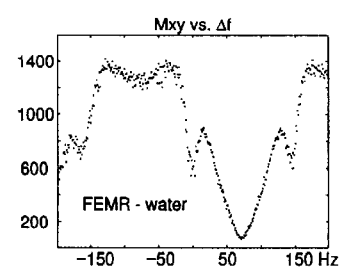 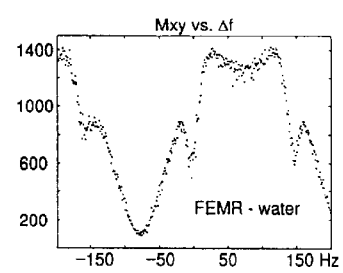
*FIG. 23A*  *FIG. 23B*  *FIG. 23C*
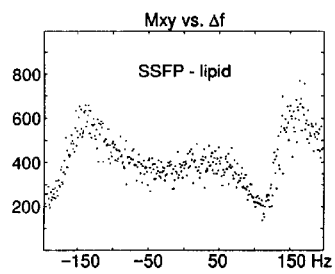 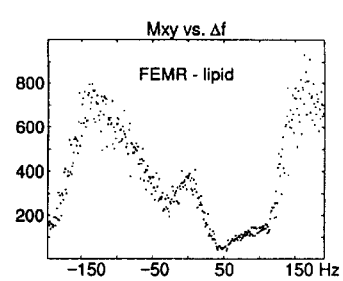 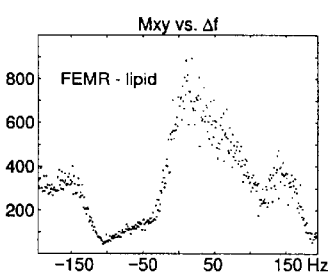
*FIG. 24A*  *FIG. 24B*  *FIG. 24C*

LINEAR COMBINATION STEADY-STATE FREE PRECESSION MRI

The U.S. government has rights in this invention pursuant to NIH Grants CA 50948, HL 39297, NS 29434 and NSF Grant BCS90-58556 to Stanford University, assignee.

BACKGROUND OF THE INVENTION

This invention relates generally to magnetic resonance imaging, and more particularly the invention relates to spectrally selective steady-state free precession (SSFP) imaging using magnetic resonance imaging.

Magnetic resonance imaging (MRI), is a non-destructive method for the analysis of materials and represents a new approach to medical imaging. It is completely non-invasive and does not involve ionizing radiation. In very general terms, nuclear magnetic moments are excited at specific spin precession frequencies which are proportional to the local magnetic field. The radio-frequency signals resulting from the precession of these spins are received using pickup coils. By manipulating the magnetic fields, an array of signals is provided representing different regions of the volume. These are combined to produce a volumetric image of the nuclear spin density of the body.

Briefly, a strong static magnetic field is employed to line up atoms whose nuclei have an odd number of protons and/or neutrons, that is, have spin angular momentum and a magnetic dipole moment. A second RF magnetic field, applied as a single pulse traverse to the first, is then used to pump energy into these nuclei, flipping them over, for example to 90° or 180°. After excitation, the nuclei gradually return to alignment with the static field and give up the energy in the form of weak but detectable free induction decay (FID). These FID signals are used by a computer to produce images.

Referring to the drawings, FIG. 1A is a perspective view partially in section illustrating coil apparatus in an NMR imaging system, and FIGS. 1B–1D illustrate field gradients which can be produced in the apparatus of FIG. 1A. This apparatus is discussed by Hinshaw and Lent. "An Introduction to NMR Imaging: From the Bloch Equation to the Imaging Equation." Proceedings of the IEEE, Vol. 71, No. 3, March, 198, pp. 338–350. Briefly, the uniform static field $B_0$ is generated by the magnet comprising the coil pair 10. A gradient field G (x) is generated by a complex gradient coil set which can be wound on the cylinder 12. An RF field $B_1$ is generated by a saddle coil 14. A patient undergoing imaging wold be positioned along the Z axis within the saddle coil 14.

In FIG. 1B an X gradient field is shown which is parallel to the static field $B_0$ and varies linearly with distance along the X axis but does no vary with distance along the Y or Z axes. FIGS. 1C and 1D are similar representation of the Y gradient and Z gradient fields, respectively.

FIG. 2 is a functional block diagram of the imaging apparatus as disclose in *NMR-A Perspective in Imaging*, General Electric Company, 1982. A computer 20 is programmed to control the operation of the NMR apparatus and process FID signals detected therefrom. The gradient field is energized by a gradient amplifier 22, and the RF coils 26. After the selected nuclei have been flipped, the RF coils 26 are employed to detect the FID signal which is passed to the receiver 28 and thence through digitizer 30 for processing by computer 20.

Magnetic resonance imaging is a major noninvasive method of medical diagnosis. However, two limitations against extending clinical applicability are cost and diagnostic sensitivity. If scan time is reduced without sacrificing SNR or contrast (sensitivity), the technique becomes more cost effective. Steady state free precession (SSFP) methods permit fast imaging with increased signal, but suffer from banding artifacts due to $B_0$ inhomogeneity. Additionally, SSFP techniques yield an undesirably intense lipid proton signal.

In accordance with the present invention, we present two related solutions addressing these issues. In one solution called fluctuating equilibrium magnetic resonance (FEMR); a novel pulse sequence is presented that produces a magnetization that fluctuates from excitation to excitation in the steady state, thus permitting the simultaneous acquisition of multiple images with differing contrast.

In accordance with the other solution to these two shortcomings of SSFP imaging, a novel postprocessing of linear combinations of Fourier data from several SSFP sequences yielding several images upon reconstruction, each with a different contrast. We call this method linear combination SSFP (LCSSFP).

SUMMARY OF THE INVENTION

In accordance with one aspect of the invention, a fast, spectrally-selective steady-state free precession (SSFP) imaging method. Combining k-space data from SSFP sequences with certain phase schedules of radiofrequency excitation pulses permits manipulation of the spectral selectivity of the image. For example, lipid and water can be rapidly resolved. The contrast of each image depends on both $T_1$, and $T_2$, and relative contribution of the two relaxation mechanisms to image contrast can be controlled by adjusting the flip angle. Several applications of the technique are presented, including fast musculoskeletal imaging, brain imaging, and angiography. The technique is referred to herein as linear combinations steady-state free precession (LCSSFP).

Briefly, the banding artifact of SSFP serves as a novel tissue contrast generation mechanism. With the correct choice of sequence repetition time (TR), all spins within a certain spectral range are suppressed while all other protons yield high signal. Furthermore, by acquiring a complete Fourier dataset multiple times, each time with an SSFP sequence with a different radiofrequency (RF) phase schedule, and then linearly combining the datasets before reconstruction, the spectral profile of the resulting image intensity is modified. Specifically, the band of suppressed Larmor frequencies can be translated and broadened. Additionally, the suppression can be eliminated altogether.

Thus, by taking different linear combinations of the datasets, multiple images can then be reconstructed, each with a different tissue contrast. Two goals are thus achieved. In particular, lipid and water can be resolved based on chemical shift differences. Since conventional lipid suppression techniques have been heretofore incompatible with an SSFP sequence, new applications of steady-state techniques are possible with this method. Secondly, SSFP is rendered immune to main field inhomogeneity artifacts.

In accordance with another aspect of the invention, certain phase schedules of radiofrequency excitation pulses produce an equilibrium magnetization that fluctuates between several values, thus permitting simultaneous acquisition of several images with different contrast features. For example, fat and water images can be rapidly acquired. The effective echo time can be adjusted using the flip angle, thus providing control over the $T_2$ contribution to the contrast.

Briefly, the banding artifact is again exploited as a novel tissue contrast generation mechanism. With an appropriate choice of sequence repetition time, all spins within a certain band of resonance frequencies can be suppressed while all other spins yield high signal. Furthermore, certain phase cycles of the radiofrequency pulse modify this spectral profile, and produce an equilibrium magnetization that fluctuates periodically from excitation to excitation. Thus, multiple images are acquired simultaneously, each with a different tissue contrast. In particular, lipid and water can be resolved based on chemical shift difference. Since conventional fat suppression techniques are incompatible with any SSFP sequence, new applications of steady-state techniques are possible with this method. Clinical applications of the technique include musculoskeletal applications, abdominal imaging, brain imaging, and fast MR angiography.

The invention and objects and features thereof will be more readily apparent from the following description and appended claims when taken with the drawings.

BRIEF DESCRIPTION OF THE DRAWINGS

FIGS. 1A, 1B, 1C and 1D illustrate the arrangement of conventional MRI apparatus and magnetic fields generated therein.

FIG. 2 is a functional block diagram of MRI imaging apparatus.

FIG. 3 is a timing diagram for two phase encoding steps for 3D free precession sequence.

FIG. 4A illustrates SSFP equilibrium transverse magnetization and FIG. 4B illustrates phase for a species with $T_1$ of 900 ms and $T_2$ of 200 ms (TR=2.5 ms).

FIGS. 8A, 8B illustrate two phase LCSSFP imaging equilibrium for $D_{0-0}+iD_{0-180}$.

FIGS. 9A, 9B illustrate two-phase LCSSFP imaging equilibrium signal from spins with resonance frequency in the middle of passband for a flip angle of 25° and 35°, respectively.

FIGS. 10A–10D illustrate experimental determination of spectral behavior of SSFP and LCSSFP with different phase combinations.

FIGS. 11A–11D illustrate experimental determination of off-resonance behavior of SSFP, two-phase LCSSFP and four-phase LCSSFP.

FIGS. 15A, 15B are graphs of $T_2$ weighing of a two-phase LCSSFP sequences showing relative signal for various flip-angles and $T_1$ relaxation times, respectively.

FIGS. 16A, 16B, 16C illustrate equilibrium transverse magnetization versus off-resonance.

FIGS. 17A, 17B illustrate equilibrium transverse magnetization after even excitation from a 0°–90° FEMR sequence.

FIGS. 18A, 18B, 18C illustrate transverse magnetization as a function of off-resonance for a FEMR sequence with flip angles of 15°, 45°, and 60°.

FIGS. 20A–20D illustrate time evolution of Mxy from excitation with 0–90 (FIGS. 20A, 20C) and 0–180–180–0 (FIGS. 20B, 20D).

FIGS. 23A, 23B, 23C illustrate experimental off-resonance behavior of SSFP and FEMR sequences.

FIGS. 24A, 24B, 24C illustrate experimental determination of off-resonance behavior of SSFP and FEMR sequences.

DETAILED DESCRIPTION OF ILLUSTRATIVE EMBODIMENTS

Described first are two variants of linear combinations steady-state free precession imaging (LCSSFP), which we will refer to as two-phase imaging and four-phase imaging. Techniques that rewind magnetization over a repetition interval have a long history in NMR spectroscopy, and though imaging sequences based on totally refocused techniques have been proposed and demonstrated over a decade ago, severe banding artifacts from field inhomogeneity have precluded widespread clinical adoption. A standard SSFP sequence is depicted in FIG. 3, which is a timing diagram for two phase encoding steps of a 3D free precession sequence. Note that magnetization is completely rewound over a repetition time, TR. Although the two RF phases are zero in the diagram, a linearly increasing phase from excitation to excitation also constituted an SSFP sequence. After every RF excitation, phase encode gradient and data acquisition, spins are completely rephased with refocusing gradients on all three axes. Thus, traverse coherences are maintained from one repetition interval to the next, and magnetization is consumed with optimal efficiency, yielding in high signal. The spectral response of the sequence depends upon the excitation flip angle, with large flip angles yielding a large passband and a narrow stopband (FIG. 4), and small flip angles producing a narrow passband and a wide stopband. Banding artifacts are a manifestation of the stopband. In FIG. 4 SSFP equilibrium transverse magnetization magnitude (left) and phase (right) for species with $T_1$ of 900 ms and $T_2$ of 200 ms (TR=2.2 ms). Spins near the resonance frequency are suppressed, so by shifting the RF frequency, a particular chemical species can be suppressed. The width of the passband and stopband inversely scale with the sequence repetition time. Note that the plots in FIG. 4 show but one cycle of periodic responses; longer TRs permit greater magnetization precession between excitation pulses, and hence, a decrease in the period of the functions shown in FIG. 4. Thus, shortening repetition times decreases the artifactual bands.

Figure 5:
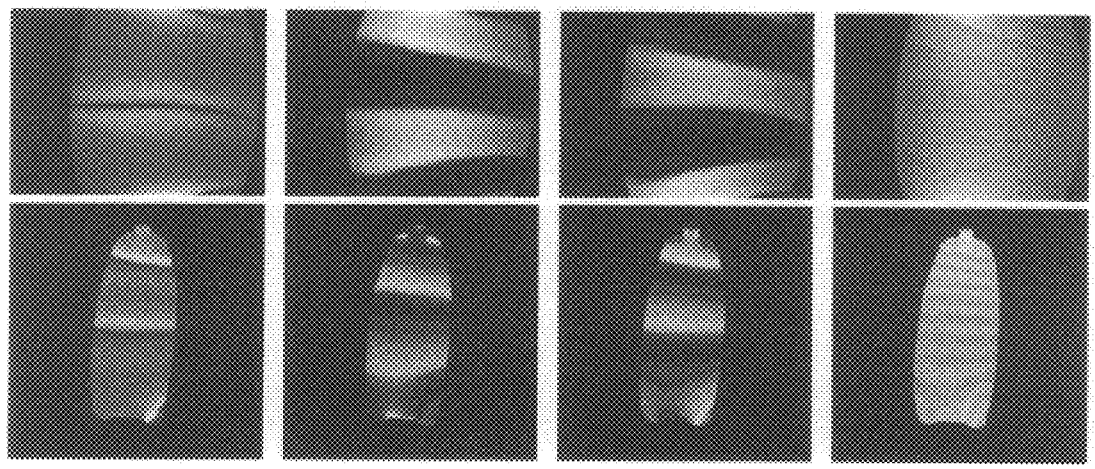
FIG. 5 illustrates images of water (to) and lipid (bottom) phantoms acquired with a constant gradient field from top to bottom of the images.

With the appropriate repetition time, the stopband described above will include the Larmor frequency of lipid spins, providing a new lipid suppression method. Unfortunately, with a narrow stopband (40 Hz at 1.5 T), the technique lacks robustness to field inhomogeneity. Additionally, the theoretical response of lipids varies from that obtained experimentally. Specifically, the experimental stopband is narrower than predicted and the signal has an unexpectedly high intensity at one edge of the stopband (FIG. 5). This is likely a variant of the so-called bright fat effect observed with fast spin echo sequences. The phenomenon occurs with rapid RF pulsing and is thought to be due to decoupling of methyl and methylene protons. Regardless of etiology, the phenomenon requires stringent constraints on main field uniformity for acceptable lipid suppression. In FIG. 5, images of water (top) and lipid (bottom) phantoms are acquired with a constant gradient field from top to bottom of the images. From left to right, images were acquired with data from an SSFP sequence, $D_{0-0}+iD_{0-180}$, $D_{0-0}-iD_{0-180}$, and $D_{0-0-0-0}+D_{0-90-180-270}+D_{0-180-0-180}+D_{0-270-180-90}$. For all sequences, a 45° excitation and 3.3 ms TR were employed. Note the relatively thin band of suppression with SSFP in the lipid image (left bottom image), and a broad region of high intensity just above it. The high intensity band may be due to decoupling of methyl and methylene protons in lipid, and the consequent increase in $T_2$ relaxation time. The two-phase images (middle two) have much broader bands of signal suppression, as predicted by theoretical off-resonance equilibrium magnetization profiles, whereas the four-phase images have no suppression bands.

Figure 6:
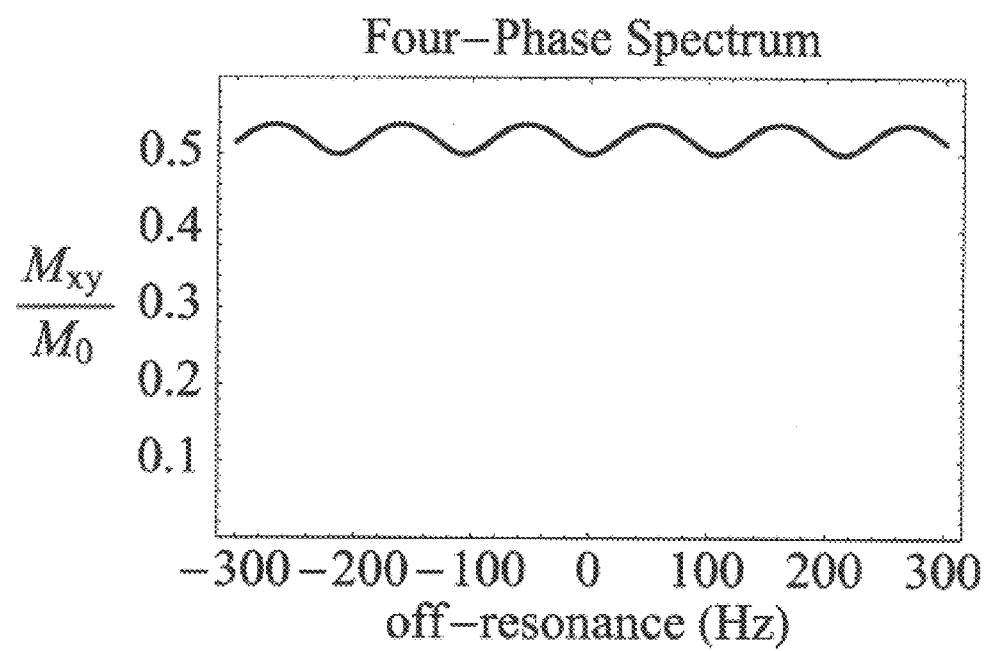
FIG. 6 illustrates four-phase equilibrium signals for a species with $T_1$ of 900 ms and $T_2$ of 200 ms (TR=2.5 ms).
Figure 7A:
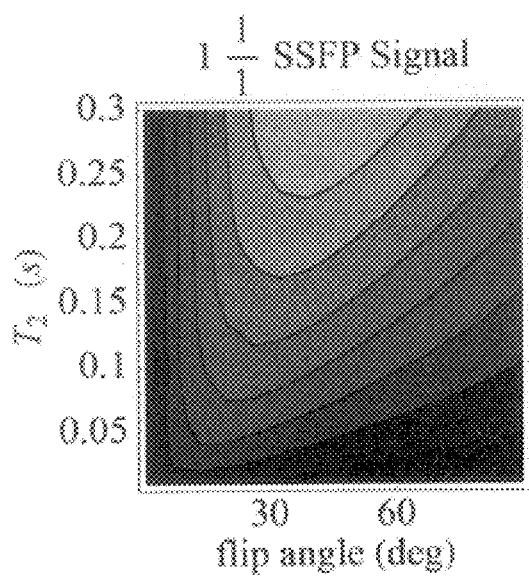
FIGS. 7A–7D illustrate SNR efficiency of SSFP, four phase, two-phase, and FEMR imaging, respectively.
Figure 7B:
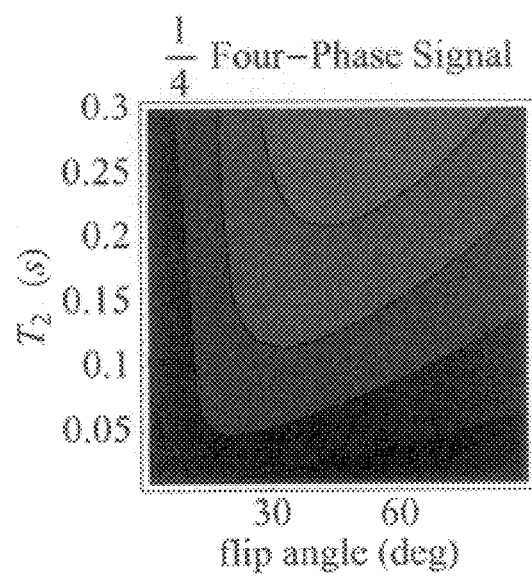
Figure 7D:
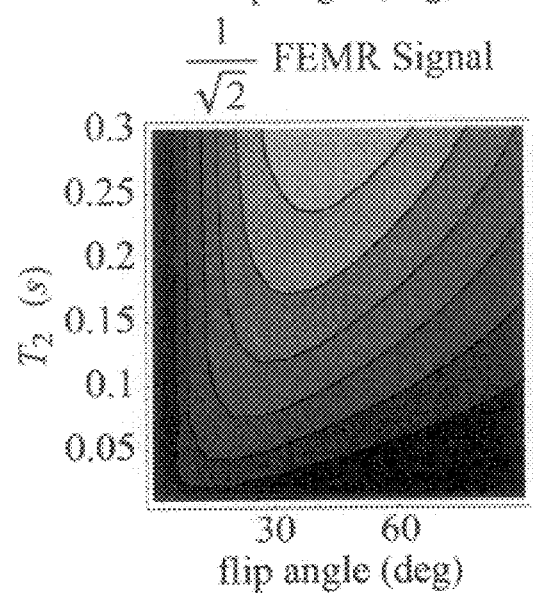
Figure 7C:
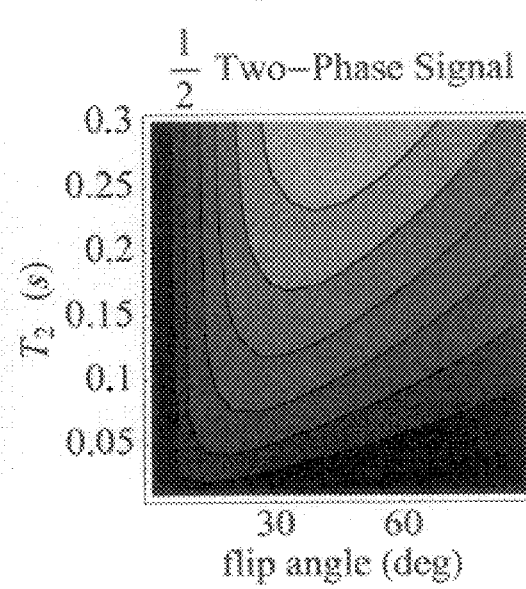

The saturation band in the spectral profile of SSFP methods plagues NMR applications, distorting resonance peaks. In this context, a solution was proposed by A. Schwenk, "NMR pulse techniques with high sensitivity for slowly relaxing systems", *J. Magn. Reson.* 5, 376–389(1971) called four-phase Fourier spectroscopy and adopted by Y. Zur, M. L. Wood, L. J. Naeringer, "Motion-insensitive, steady-state free precession imaging," *Mag. Res. Med.* 16:444–459 (1990). Both solutions entail repeating the SSFP measurement four times, each time with a different RF carrier frequency or phase cycle, and then complexly summing the free induction decay signals. The resulting spectral profile is very uniform in both magnitude and phase. The present invention utilizes a similar modification to SSFP imaging. Specifically, a full data set is acquired with four SSFP sequences with RF excitation phase cycles: 0-0-0-0, 0-90-180-270, 0-180-0-180, and 0-270-180-90. Although k-space data from each imaging sequence can be reconstructed independently, we first complexly sum the data from the four experiments to generate new k-space data. The magnitude of the resulting spectral profile is shown in FIG. 6. In FIG. 6, a four-phase equilibrium signal is shown for species with $T_1$ of 900 ms and $T_2$ of 200 ms (TR=2.2 ms). The spectrum is fairly uniform, as compared with that for SSFP. Thus, there should be no banding artifacts in images acquired with the four-phase method.

Although requiring greater scan times, the four-phase technique and two phase technique yield a higher SNR compared with that of standard SSFP imaging or FEMR imaging. Nonetheless, the technique is less SNR efficient than standard SSFP imaging (FIG. 7). In FIG. 7 the SNR efficiency of four-phase and two-phase variations of LCSSFP imaging is comparable with that SSFP. The contour plots show normalized transverse magnetization as a function of flip angle and $T_2$ for a species with a $T_1$ of 900 ms, and a TR of 2.5 ms for all sequences. Lighter shades represent greater signal. To account for scan time differences, the contour plots are of signals have been multiplied by a factor proportional to the inverse of the square root of the relative scan times. Contour levels are in increments of 0.04 with black implying 0–0.04 and white 0.36–0.4. For fluoroscopic imaging, although a compromised temporal response is inevitable, a sliding reconstruction window results in an identical image frame rate as conventional sequences. Specifically, the four SSFP sequences are repeated indefinitely, and after a complete data set is acquired with each sequence, an image is reconstructed with the most recently acquired four data sets.

We here generalize the notion of using linear combinations of data from multiple SSFP sequences from creating a uniform spectral response to generating an arbitrary spectral response. For example, a least squares approach can be taken using translated SSFP spectral responses as basis functions, the translated SSFP spectral response being realized by modifying the RF phase cycle. Other spectral responses can be achieved by varying the excitation flip angle and the sequence repetition time. In particular, for some linear combinations, the stopband of the spectral profile is much broader. For example, if we denote data from an SSFP sequence with a phase cycle of 0°–0° as $D_{0-0}$, and data from an SSFP sequence with phase cycle of 0°–800° as $D_{0-180}$, then $D_{0-0}+iD_{0-180}$ and $D_{0-0}-iD_{0-180}$ both have spectral profiles with relatively broad stopbands. Moreover, the two profiles are nearly orthogonal (FIG. 8). In FIG. 8 two-phase LCSSFP imaging equilibrium signal for sequences with TR=2.5 ms are shown. Left graph shows spectrum of $D_{0-0}-iD_{0-180}$ for species with $T_1$ of 170 ms and $T_2$ of 40 ms, i.e., lipid. Left graph shows spectrum of $D_{0-0}+iD_{0-180}$ for species with $T_1$ of 900 ms and $T_2$ of 200 ms, i.e. blood. Note that the two spectra are nearly orthogonal, so images reconstructed from the two linear combinations of data are of spins from two different regions of the spectrum. Hence, one image will be of water protons, the other of lipid protons. Thus, by acquiring two Fourier datasets, two images can be reconstructed using these two linear combinations of the data; one image is generated from spins within a certain band of resonance frequencies, and the other image from spins within another band of resonance frequencies. With the appropriate choice of repetition time (2.2 ms at 1.5 T), the centers of the two passbands can be placed 220 Hz apart: one image is then of predominantly water spins, while the other image is mainly lipid spins. Hence, we have a novel water-lipid separation method, which we will refer to as a two-phase technique. Although twice the scan time is required compared with SSFP to achieve the lipid suppression, the SNR efficiency is not compromised compared with that of SSFP or FEMR imaging (FIG. 7).

A related approach to the two-phase and four-phase imaging methods was proposed by Zur et al., (Y. Zur, M. L. Wood, and L. J. Neuringer, "Motion Insensitive Steady-State Free Precession Imaging," *Magn. Reson. Med.*, 16:444–459, 1990). In the Zur paper they are looking for methods to obtain uniform signal response, and view the problem as eliminating the interference between different "echoes", each coming from a different coherence pathway, and each having a different contrast, and dependence on off-resonance frequency. They achieve this by acquiring a sequence of N steady state images, each with a different phase increment between RF pulses. The first image has a zero phase increment, the second image an increment of 360/N, and the kth image and increment of 360*(k−1)/N. These images are then processed by an N point DFT on a pixel by pixel basis to produce images that correspond to each "echo", or coherence pathway. The zero frequency term, which is the sum of all of the N images, corresponds to the two or four phase image as proposed here.

The new aspect presented here is that we can combine the signals from these "echoes", and use the fact that these have different phase profiles due to their different dependence on the resonant frequency. This causes destructive interference for some spectral bands, which suppresses the signals from spins at these frequencies. It also causes constructive interference for other spectral bands, which enhances signals from these bands. With proper design, we can obtain a passband for water spins and a stopband for lipid spins, which are at a 230 Hz lower spectral frequency at 1.5 T. Hence, by forming linear combinations of the echoes computed by Zur, we can obtain the additional important feature of obtaining spectral selectivity in a steady state sequence. This is a remarkable capability.

As an example of using this perspective to describe the methods we have been proposing, consider the two phase water selective method proposed above. Here N=2, and the phase increments are 0 for the first image (D0–0), and 180 for the second image (D0–180). The 2-point DFT of these two images reduces to the sum of the two images, (A0=D0–0+D0–180), and the difference of the two images (A1=D0–0−D0–180). According to the method we propose, the water selective images W is D0–0+i*D0–180, which is simply $$W = D0-0 + i*D0-180$$
$$= \frac{1}{2}(A0+A1) + (i/2) * (A0 - A1)$$
$$= (\frac{1}{2}+i/2)*A0 + (\frac{1}{2}-i/2)*A1$$

Hence, by forming complex combinations of the echo images described by Zur, we can obtain spectral selectivity.

LCSSFP has similar $T_1$ and $T_2$ contrast properties as SSFP; signal is proportional to $T_2/T_1$, as shown in FIG. 9. In FIG. 9, two-phase LCSSFP imaging equilibrium signal is shown from spins with resonance frequency in the middle of the passband for sequences with TR=2.5 ms and linear combination $D_{0-0}+iD_{0-180}$. The nearly straight contours of constant signal indicate a $T_2/T_1$ contrast. However, since most tissues of interest lie in the lower right corner of the graph, the contrast of two-phase LCSSFP imaging is very similar to $T_2$-weighting.

We now present experimental verification of the predicted behavior of the LCSSFP methods, followed by some applications. All studies employed a GE Signa 1.5 T scanner. To ascertain the spectral response of the sequences, 2D field maps of water and lipid (soybean oil) phantoms were acquired with a continual shim field gradient applied in one direction (FIG. 5) which generated a spatially varying Larmor frequency. Then, again with a continual shim field gradient, the phantoms were imaged with SSFP and LCSSFP sequences. Registering the images with the field maps then permitted derivation of the spectral response of the sequences (FIGS. 10 and 11). FIG. 10 shows experimental determination of spectral behavior of (from left to right) SSFP, LCSSFP with $D_{0-0}+iD_{0-180}$, LCSSFP with $D_{0-0}-D_{0-180}$, and $D_{0-0-0-0}+D_{0-90-180-270}+D_{0-180-0-180}+D_{0-270-180-90}$. A water phantom with $T_1$ and $T_2$ of 82 ms was imaged with both sequences while a shim gradient was applied to generate a population of spins with varying resonance frequency. Registering a field map with the acquired images permits determination of equilibrium signal as a function of off-resonance. With a TR of 3.3 ms, the signal (vertical axis) as a function of off-resonance (horizontal axis) should be periodic, with a period of 300 Hz. The vertical scale is arbitrary. FIG. 11 shows experimental determination of off-resonance behavior of (from left to right) SSFP, two-phase LCSSFP with $D_{0-0}+iD_{0-180}$, two-phase LCSSFP with $D_{0-0}-iD_{0-180}$, and four-phase $D_{0-0-0-0}+D_{0-90-180-270}+D_{0-180-0-180}+D_{0-270-180-90}$. A lipid phantom with $T_1$ of 165 ms and $T_2$ of 37 ms was imaged with both sequences while a shim gradient was applied to generate a population of off-resonance spins. Registering a field map with the acquired images permits determination of signal (vertical axis) as a function of resonance frequency (horizontal axis). With a TR of 3.3 ms, the signal as a function of resonance frequency should be periodic, with a period of 300 Hz. The vertical scale is arbitrary. Note the larger ripple in the four-phase spectrum compared with that in the water phantom of FIG. 10. Through water phantom results parallel theoretical calculations, lipid phantoms betray an intense signal band in SSFP and two-phase images that is unanticipated by modelling spin dynamics with the Bloch equations. As mentioned above, spin decoupling between protons in lipids may be prolonging $T_2$ relaxation times. However, a suppression band in two phase images is still present in the lipid images, one broad enough to permit practical lipid suppression.

Figures 12A, 12B:
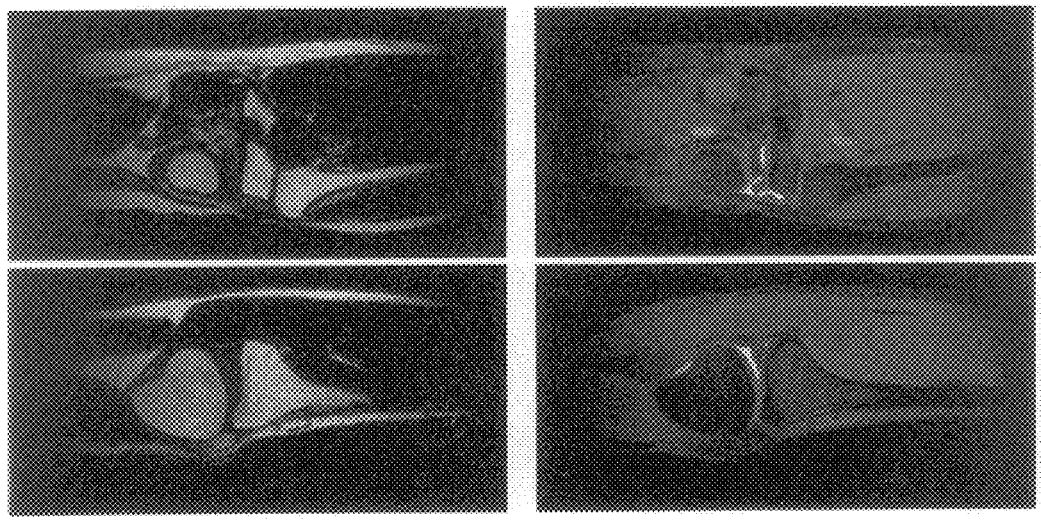
FIGS. 12A, 12B illustrate sagittal and coronal images from a 3D knee scan using two-phase LCSSFP.

Water and lipid images can be rapidly obtained with two-phase imaging. The optimal repetition time is 2.2 ms at 1.5 T, separating the centers of the passband and stopband of the spectral profiles of both images by 220 Hz. Making full use of the lipid image, it serves as a mask to suppress the display of the remaining lipid regions in he predominantly-water image. Specifically, all pixels in the water image corresponding to the high intensity pixels in the lipid image are nulled. Though the method may introduce artifacts when voxels harbor both water and lipid protons, these artifacts may be innocuous in applications involving maximum intensity projections, such as MR angiography. As an alternative, lipid and water images may be subtracted. As a 3D technique, two-phase imaging may serve well in musculoskeletal imaging applications, particularly to survey rapidly large volumes. FIG. 12 shows an example, demonstrating lipid suppression and bright synovial fluid. FIG. 12 includes sagittal and coronal images from a 3D knee scan using two-phase LCSSFP ($D_{0-0}+iD_{0-180}$ and ($D_{0-0}-iD_{0-180}$) with TR=2.7 ms, a 26° flip angle, and an extremity coil. The left images show predominantly fat, while the right images are mainly water. Synovial fluid and cartilage have high and intermediate signal intensities, respectively, on water images, whereas bone marrow and subcutaneous fat are bright in the lipid images. A total imaging time or 28×14×14 $cm^3$ FOV with 1.1 mm isotropic resolution of 84 seconds includes both lipid and water image acquisition time.

Figures 13A, 13B, 13C, 13D, 13E:
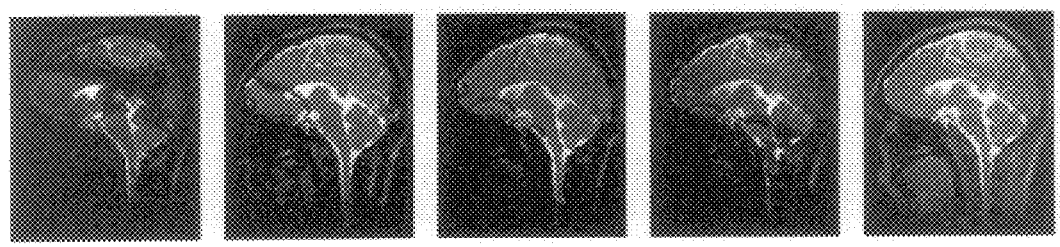
FIGS. 13A–13E illustrate sagittal images from a 2D scan using standard SSFD (A–D) and four-phase imaging (E).

An application of the four-phase technique is high-SNR brain imaging with $T_2$-like contrast. FIG. 13 shows sagittal images from a 2D scan with a head coil using standard SSFP (from left to right, $D_{0\text{-}0\text{-}0\text{-}0}$, $D_{0\text{-}90\text{-}180\text{-}270}$, $D_{0\text{-}180\text{-}0\text{-}180}$, and $D_{0\text{-}270\text{-}180\text{-}90}$). Sequence parameters were TR=15 ms, a 45° flip angle, 256×256 resolution over 32 cm FOV. The four SSFP images show the characteristic banding artifact, due to field inhomogeneity, whereas the four-phase image betrays no such artifact. Although FIG. 13 shows implementation of the technique s a 2DFT sequence, 3D imaging is also possible, as is non-Cartesian k-space coverage. The SNR of cerebrospinal fluid in the four-phase image of FIG. 13 is 60, and no banding artifacts are present.

Figure 14:
FIG. 14 is an image of maximum intensity projection (MIP) delineating the popliteal artery using two SSFP sequences.

Since arterial blood has a relatively long $T_2$ relaxation time of 220 ms compared with that of muscle, connective tissue and venous blood (35 ms, 35 ms, and 100 ms, respectively), a novel type of flow-independent angiography is possible with LCSSFP. A large three dimensional volume can be rapidly imaged at high resolution, without the expense and inconvenience of administering a contrast agent. FIG. 14 shows the feasibility of this application of two-phase imaging. As high SNR lipid images are concomitantly obtained, atherosclerotic plaque assessment may also be possible. FIG. 14 is a maximum intensity projection (MIP) delineating the popliteal artery. Images were obtained with two SSFP sequences with TR=2.7 ms, 26° flip angle, giving 1.1 mm isotropic resolution over 28×14×14 cm³ FOV in 84 seconds ($D_{0\text{-}0}+iD_{0\text{-}180}$). The bright regions are synovial fluid.

We have described and demonstrated two methods, two-phase and four-phase imaging, based on novel and simple processing algorithms for data acquired with SSFP sequences. Two-phase imaging provides water/lipid discrimination, whereas four-phase imaging yields high SNR images without the banding artifact seen in standard SSFP sequences. In images of phantoms acquired in the presence of a large shim gradient field, the banding artifact is replaced by seams (FIG. 5). However, these seams are absent from in vivo images acquired without shim fields.

Because free precession sequences maintain transverse coherences, species with long $T_2$ or $T^*_2$ yield relatively high signal. For four such sequences (SSFP, two-phase, four-phase, and FEMR), the optimal flip angle for maximizing contrast of tissues with $T_2$ relaxation times between 0 and 200 ms is approximately 30 degrees, as can be seen from FIG. 7. However, although the optimal flip angle is the same for all sequences, four-phase and especially two-phase imaging yield greater contrast, whereas FEMR essentially mirrors SSFP in this respect.

Thus the method described herein is ideal for imaging long $T_2$ species, such as blood (angiography, FIG. 14), biliary fluid (cholangiography), cerebrospinal fluid (myelography), and joint fluid (FIG. 12). Also, oxygenation measurement and functional MRI can benefit. Fluoroscopic MRI in general, and cardiac fluoroscopy in particular, can take advantage of the method's high speed and signal.

Two-phase imaging provides a unique method of lipid suppression in rapid imaging. FIG. 15 illustrates $T_2$ weighting of a two-phase LCSSFP sequence. Left and right graphs (FIGS. 15A, 15B) show relative signal with a two-phase LCSSFP sequence for various flip angles and $T_1$ relaxation times, respectively. Conventional methods of lipid suppression, such as chemically selective saturation (CHESS), exploit chemical shift differences over a single repetition interval. Thus, the duration of RF excitation pulses required to achieve spectral selectivity is determined by the relative chemical shifts of water and lipid protons, a 200 Hz shift of 1.5 T implying pulses longer than 5 ms. Besides lengthening scan time and reducing SNR efficiency, achieving fat suppression with such a lengthy excitation in a refocussed imaging sequence would present severe banding artifacts since the long excitation pulse enforces a long repetition time. Furthermore, conventional methods require large unrefocussed gradients, and are thus incompatible with any refocussed imaging sequence. Similarly, spectral-spatial pulses are relatively long in duration. Inversion nulling of lipids is incompatible with the desired steady-state signal from water protons.

Diagnostic situations requiring $T_2$-like weighting and fat suppression are amenable to the method described in this paper, i.e., abdominal, pelvic, and breast MRI. For example, hepatic lesion detection requires $T_2$-weighted imaging with echo times greater than 80 ms, and lesion characterization necessitates echo times in excess of 120 ms. Additionally, the concomitant lipid image may prove particularly useful, as in discrimination between focal sparing in diffuse fatty metamorphosis of the liver and neoplastic involvement. Similarly, comparison of lipid and water images may permit assessment of microscopic and macroscopic fat in adrenal lesions, and hence discrimination of adrenal adenomas from malignancies, as in phase-contrast imaging.

Additionally, species with a relatively high $T_2/T_1$ ratio yield high signal. Thus, contrast-enhanced angiography is possible with this fast imaging method; since angiograms can be obtained without contrast (FIG. 14), very low doses of gadolinium may be employed, permitting imaging at multiple anatomic stations without exceeding dosing guidelines. Studies of contrast agent uptake kinetics are becoming more common in brain, breast, and abdominal imaging; optimal optimal use requires rapid injection and imaging, since equilibrium between intravascular and interstitial spaces can be quick. Alternatively, fast imaging with $T_2$ shortening agents, such as superparamagnetic iron oxide may be useful.

Besides proton MRI, phosphorus MRI, with intrinsically lower sensitivity, may benefit since inorganic phosphorus and phosphocreatine are two species with relatively long $T_1$ and $T_2$ relaxation times. In particular, these two species are analogous to lipid and water protons: their chemical shifts permit creation of separate images. Since phosphorus has a smaller gyromagnetic ration by a factor of three, the repetition time may be prolonged by a factor of three, permitting longer data acquisition windows, and hence, greater SNR.

The sequence is compatible with a number of readout strategies, including but not limited to, 2DFT, 3DFT, spirals, stack of spirals, and echo planar. However, fast gradient sets are a prerequisite, and though such systems are becoming more common, an alternative approach employing lower field strength has been advocated recently by J. L. Duerk, et al, "Remember True FISP? A high SNR near 1-second imaging method for $T_2$-like contrast in interventional MRI at 0.2 T", *J. Magn. Reson. Imaging* 8, 203–408 (1998). For example, the optimal repetition time for water/lipid discrimination at 0.5 T is 6.6 ms, compared with 2.2 ms at 1.5 T. However, four-phase imaging places no constraints on sequence TR and is compatible with any gradient system.

LCSSFP is a novel, fast, high-signal, noninvasive imaging technique. With different linear combinations of Fourier data from SSFP sequences, several images, each with different contrast, can be reconstructed. Flexible control of the relative $T_2$ contribution to contrast in images is achieved by varying the flip angle of RF excitation. Though very simple in concept and implementation, one variation called two-phase imaging addresses the important problem of incorporating water-lipid discrimination into fast, high SNR refocussed techniques. Additionally, another variation called four-phase imaging eliminates the banding artifact of SSFP imaging. We have demonstrated the feasibility of several natural applications: musculoskeletal, brain, and angiographic imaging.

Consider now the fluctuating equilibrium magnetic resonance (FEMR) aspect of the invention. Referring again to the timing diagram of FIG. 3, the two phase encoding steps are again utilized (one phase encode repeated twice), but two RF excitation phases (0, 90) are employed.

After every excitation, phase encode and readout, magnetization is completely rewound with refocusing gradients on each axis. Thus, coherences are maintained from excitation to excitation, resulting in high equilibrium signal. The off-resonance properties of the sequence depend upon the excitation flip angle, with relatively high flip angles giving a large passband and a narrow stopband (FIG. 16), whereas low flip angles produce a narrow passband and a wide stopband. FIG. 16 shows equilibrium transverse magnetization versus off-resonance for species with $T_1$ of 170 ms and $T_2$ of 40 ms. Left graph assumes a standard steady-state free precession (SSFP) sequences with a 2.2 ms repetition time. Spins near the resonance frequency are suppressed, so by shifting the RF excitation frequency, a particular chemical species can be suppressed. The middle and right graphs depict transverse magnetization just after the even and odd excitations, respectively, of a FEMR sequence with RF phase cycle of 0°–90°. Signal emanates alternately from spins at 100 and −100 Hz relative to the RF excitation frequency. The width of the passband scale inversely with the sequence repetition time. The artifactual bands mentioned in the introduction are a manifestation of the stopband. Note that FIG. 16 shows only one cycle of functions that are periodic with off-resonance frequency; longer repetition times yield greater magnetization precession, and hence, more oscillations of the equilibrium magnetization over a given range of off-resonance values. Thus, brief repetition times minimize banding artifacts from magnetic field inhomogeneity.

Figure 19:
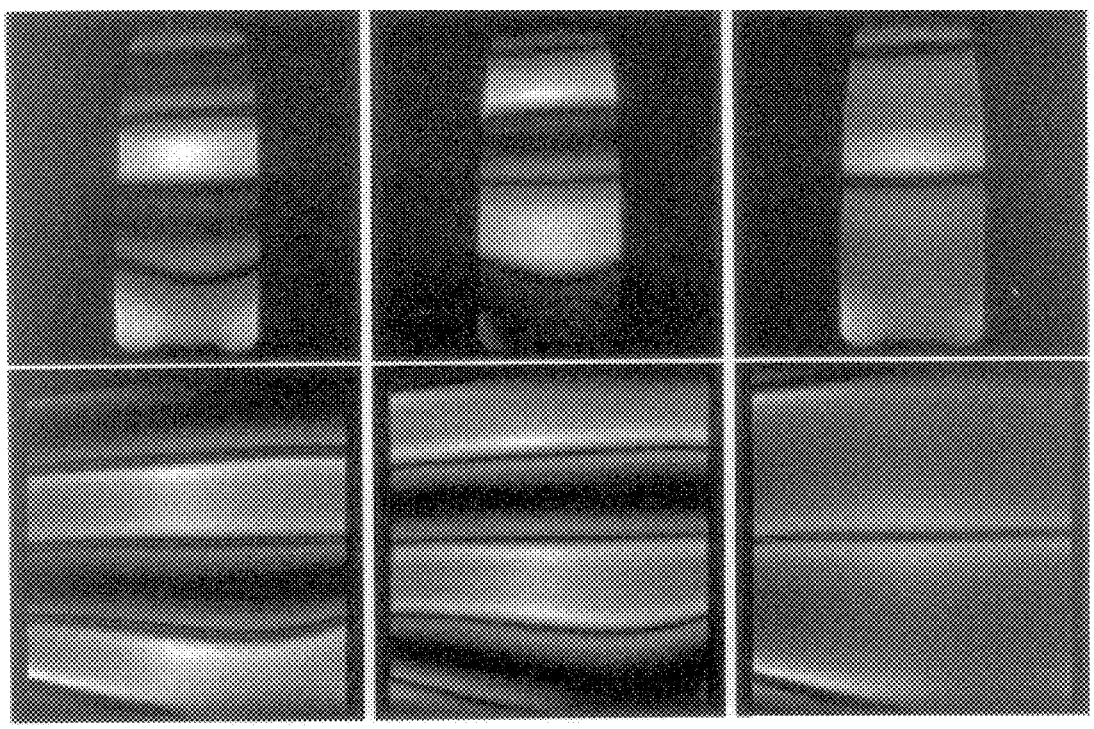
FIG. 19 illustrates axial images of lipid (top) and water (bottom) phantoms acquired with a shim gradient field running from top to bottom of each image.
Figure 21A:
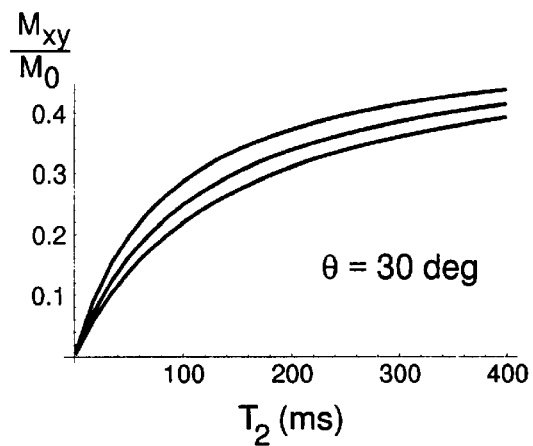
FIGS. 21A, 21B are graphs of signal versus $T_2$ for a 0–90 FEMR sequence.
Figure 21B:
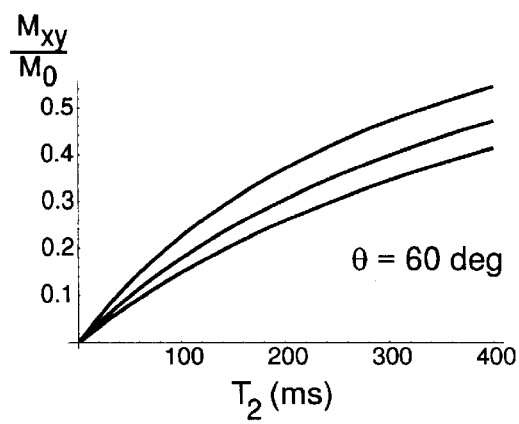
Figure 22:
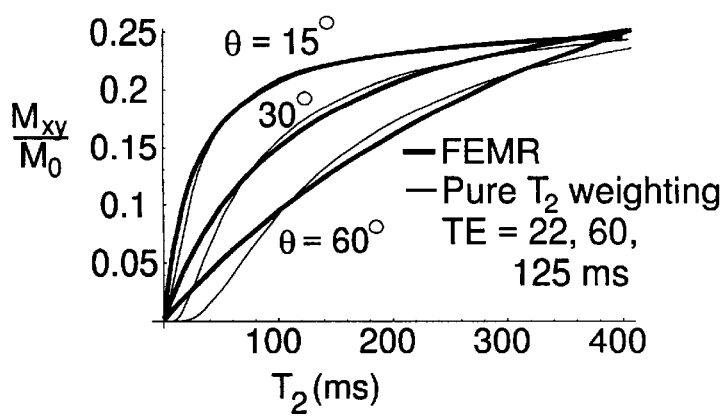
FIG. 22 is a graph of rapid $T_2$-like weighting with the FEMR sequence.

With appropriate flip angles and repetition times, the off-resonance stopband described above can be designed to include the resonance frequency of lipid protons, thus yielding a novel fat suppression technique. (FIG. 16, FIG. 17, FIG. 18). FIG. 16 shows equilibrium transverse magnetization versus off-resonance for species with $T_1$ of 170 ms and $T_2$ of 40 ms. Left graph assumes a standard steady-state free precession (SSFP) sequences with a 2.2 ms repetition time. Spins near the resonance frequency are suppressed, so by shifting the RF excitation frequency, a particular chemical species can be suppressed. The middle and right graphs depict transverse magnetization just after the even and odd excitations, respectively, of a FEMR sequence with RF phase cycle of 0°–90°. Signal emanates alternately from spins at 100 and −100 Hz relative to the RF excitation frequency. The width of the passband scale inversely with the sequence repetition time. FIG. 17 shows equilibrium transverse magnetization for a species with $T_1$ of 900 ms and $T_2$ of 200 ms just after even excitations from a 0°–90° FEMR sequence. Left graph shows magnitude and right graph phase. Note that the phase variation over the passband is relatively small, and hence results in minimal signal loss. FIG. 18 shows transverse magnetization ($M_0$=1) as a function of off-resonance (Hz) for a FEMR sequence with flip angles (left to right) of 15°, 45°, and 60°. Unfortunately, the technique is not very robust to field inhomogeneity, since the stopband is rather narrow (approximately 40 Hz). Additionally, in the case of lipids, the classically predicted behavior differs from that obtained experimentally. In particular, the experimental stopband is even narrower than expected and the signal intensity has an unexpected peak at one edge of the stopband (FIG. 19). In FIG. 19 axial images of lipid (top) and water (bottom) phantoms acquired with a shim gradient field running from the top to the bottom of the image. Left and center images were acquired with a 2DFT FEMR sequence with 0–90 phase cycle, and the right images were acquired with a 2D SSFP sequence. For both sequences a 45° excitation, 0.6 fractional echo, and 2.5 ms TR were employed. Note the relatively thin band of suppression with SSFP (right images) and a broad region of high intensity just above it. This pattern, lacking in the water image, may be due to decoupling of methyl and methylene protons in lipid, and the consequent increase in $T_2$ relaxation time. However, the FEMR-acquired images have much broader bands of signal suppression as predicted by theoretical off-resonance equilibrium magnetization profiles. This is presumably due to decoupling of methyl and methylene protons, a well-known effect in fast spin echo (FSE) imaging (20, 21, 22). FIG. 20 shows time evolution of $M_{xy}$ from excitation with 0°–90° (100 Hz off-resonance, left graphs) and 0°–180°–180°–0° phase cycles (zero Hz off-resonance, right graphs). The upper graphs show $M_{xy}$ immediately after even excitations, whereas the lower graphs show $M_{xy}$ after odd excitations. The two phase schemes exhibit identical equilibrium behavior, but the 0°–90° cycle reaches equilibrium in about one second, whereas the 0°–180°–180°–0° cycle requires approximately four seconds. FIG. 21 shows signal versus $T_2$ for a 0°–90° FEMR sequence with TR of 2.5 ms and two flip angles of 30° and 60°. From top to bottom, the curves are for species with $T_1$ of 600, 800, and 1000 ms. FIG. 22 shows the FEMR sequence affords rapid $T_2$-like weighting. The thicker curves show the equilibrium signal for a species with $T_1$ of 800 ms for flip angles of 15°, 30°, and 60°. The thinner curves are best fits of $\alpha \exp(TE/T_2)$ with a TE of 22, 60, and 125 ms. Thus, greater $T_2$-like weighting is achieved by higher flip angles. Thus, the narrower stopband exhibited experimentally demands unacceptably severe constraints on field homogeneity to ensure adequate lipid suppression.

However, certain phase cycles of radiofrequency excitation modify the spectral profile of equilibrium magnetization, translating and increasing the width of the stopband. For instance, if the RF phase is incremented each excitation, the suppression band is translated. Alternatively, with a radiofrequency pulse phase schedule of 0°–90° or 0°–180°–180°–0°, the equilibrium magnetization fluctuates between two profiles from excitation to excitation, as shown in FIG. 16. FIG. 16 shows equilibrium transverse magnetization versus off-resonance for species with $T_1$ of 170 ms and $T_2$ of 40 ms. Left graph assumes a standard steady-state free precession (SSFP) sequence with a 2.2 ms repetition time. Spins near the resonance frequency are suppressed, so by shifting the RF excitation frequency, a particular chemical species can be suppressed. The middle and right graphs depict transverse magnetization just after the even and odd excitations, respectively, of a FEMR sequence with RF phase cycle of 0°–90°. Signal emanates alternately from spins at 100 and −100 Hz relative to the RF excitation frequency. The width of the passband and stopband scale inversely with the sequence repetition time. Though the two phase schedules have identical equilibrium behavior, they are not physically equivalent, as discerned from their approaches to equilibrium (FIG. 20). FIG. 20 shows time evolution of $M_{xy}$ from excitation with 0°–90° (100 Hz off-resonance, left graphs) and 0°–180°–180°–0° phase cycles (zero Hz off-resonance, right graphs). The upper graphs show $M_{xy}$ immediately after even excitations, whereas the lower graphs show Mxy after odd excitations. The two phase schemes exhibit identical equilibrium behavior, but the 0°–90° cycle reaches equilibrium in about one second, whereas the 0°–180°–180°–0° cycle requires approximately four seconds. The mathematical expression for the equilibrium magnetization is presented in the appendix of this application. Note that the equilibrium transverse magnetization after the even and odd excitations have off-resonance profiles nearly orthogonal; hence, two images can be simultaneously acquired by parsing data from even excitations to form one image, and from odd excitations to form another. Each image then represents spins in a different resonant frequency range, although there is some overlap since the stopband is not perfect. We will refer to this method as fluctuating magnetic resonance (FEMR).

FEMR yields contrast based on a combination of $T_1$ and $T_2$, with the relative $T_2$ contribution controlled by changing the flip angle. FIG. 21 shows equilibrium magnetization for a number of flip angles and values of $T_1$; species with long $T_2$ and short $T_1$ yield high signal. One can calculate an effective echo time, as shown in FIG. 22. FIG. 21 shows signal versus $T_2$ for a 0°–90° FEMR sequence with TR of 2.5 ms and two flip angles of 30° and 60°. From top to bottom, the curves are for species with $T_1$ of 600, 800, and 1000 ms. FIG. 22 shows the FEMR sequence affords rapid $T_2$-like weighting. The thicker curves show the equilibrium signal for a species with $T_1$ of 800 ms for flip angles of 15°, 30°, and 60°. The thinner curves are best fits of a exp $(TE/T_2)$ with a TE of 22, 60, and 125 ms. Thus, greater $T_2$-like weighting is achieved by higher flip angles.

For comparison, assuming an effective echo time of $T_2$, a 2D FSE sequence with enough interleaved slices for complete $T_1$ recovery gives a signal of 0.37 $M_0$; for a species with $T_1$ of 1000 ms and $T_2$ of 50 ms, signal is about 0.1$M_0$ with FEMR. Assuming equivalent voxel sizes and bandwidths, a 3D FEMR sequence yields greater SNR when fourteen or more slices are acquired. However, the scan time is significantly reduced; each slice-selective 180° pulse in FSE takes approximately twice as long as a entire repetition time for FEMR. Thus, even with double the number of excitations for fat-water separation in FEMR, the scan time is approximately half. Thus, FEMR offers equal or higher SNR than 2D FSE in approximately half the scan time. Besides the faster scan time and SNR advantage of FEMR over FSE. FEMR may offer superior image sharpness and $T_2$-like contrast since the long echo train of FSE samples magnetization with variable $T_2$ weighting.

We now present experimental confirmation of the predicted behavior of the FEMR sequence and then some applications of the method. All experiments were conducted with a GE Signa 1.5 T scanner. To ascertain the off-resonance behavior of the SSFP and FEMR sequences, 2D images and field maps of water and lipid (soybean oil) phantoms were acquired with a shim field gradient applied in one direction. The shim field produces a spatially varying off-resonance. Registering the images with the fieldmaps then permits assessment of transverse magnetization of spins with a given resonance frequency (FIGS. 23 and 24). FIG. 23 shows experimental determination of off-resonance behavior of SSFP and 0°–90° FEMR sequences with a TR of 3.3 ms. A water phantom with $T_1$ and $T_2$ of 82 ms was imaged with both sequences while a shim gradient was applied to generate a spectrum of off-resonance spins. Registering a field map with the acquired images permits determination of equilibrium transverse magnetization as a function of off-resonance, as shown above (from left to right: SSFP, FEMR odd excitations, and FEMR even excitations). With a TR of 3.3 ms, the transverse magnetization as a function of off-resonance is periodic with a period of 300 Hz. The vertical scale is arbitrary. FIG. 24 shows experimental determination of off-resonance behavior of SSFP and 0–90 FEMR sequences with TR of 3.3 ms. A lipid phantom (soybean oil) with $T_1$ of 165 ms and $T_2$ of 37 ms imaged with both sequences while a shim gradient was applied to generate a spectrum of off-resonance spins. Registering a field map with the acquired images permits determination of equilibrium transverse magnetization as a function of off-resonance, (from left to right: SSFP, FEMR, odd excitations, and FEMR even excitations). With a TR of 3.3 ms, the transverse magnetization as a function of off-resonance is periodic with a period of 300 Hz. The vertical scale is arbitrary. Although results with water phantoms match theoretical calculations, lipid phantoms show a band of intense signal unanticipated by the Bloch equations. As mentioned above, this may be due to spin coupling between various protons in lipids. However, a suppression band is still present in the lipid images, one broad enough to permit adequate lipid suppression in several applications.

Figure 25:
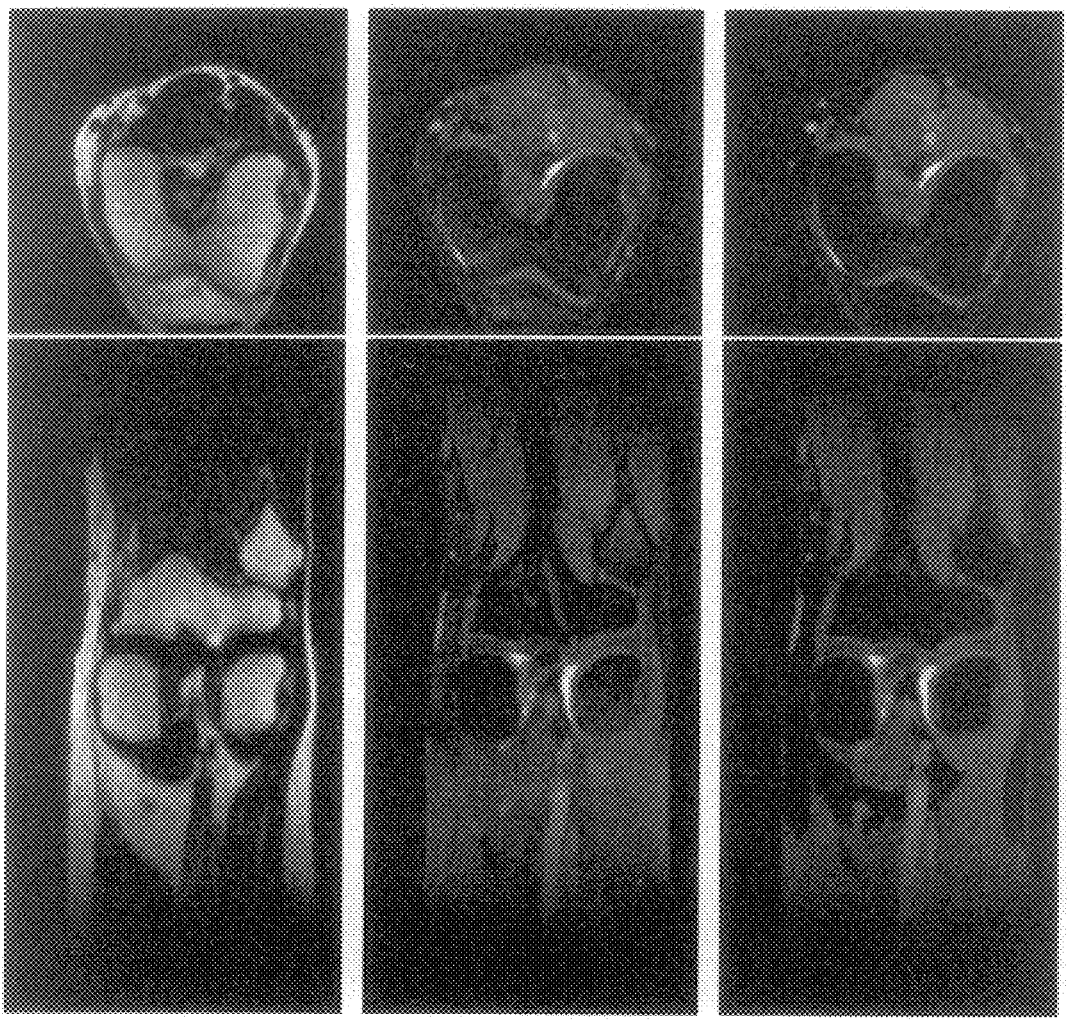
FIG. 25 illustrates axial and coronal images from a 3DFT knee scan using 0–90 FEMR sequences.
Figure 26:
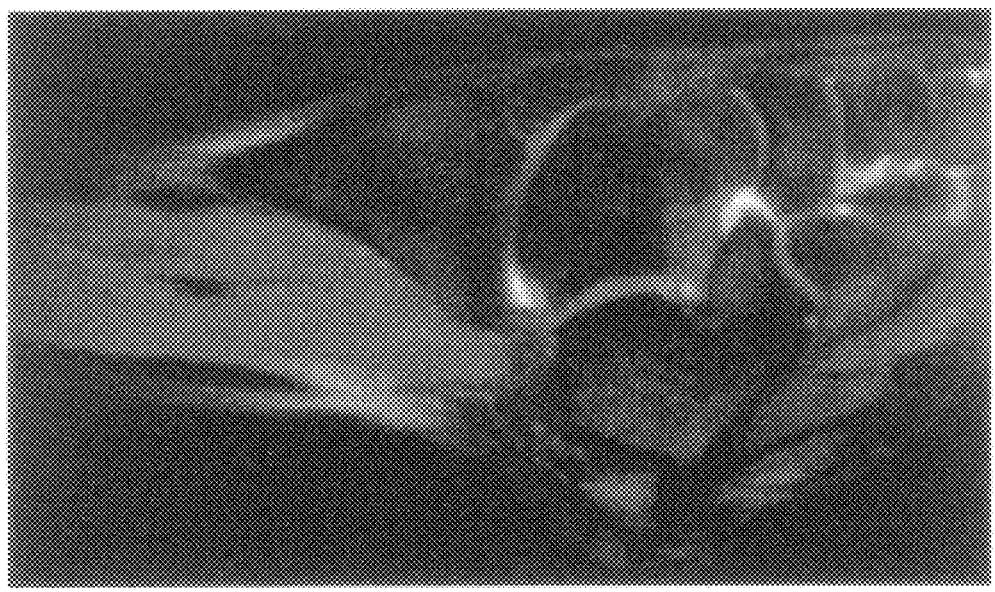
FIG. 26 illustrates a cropped sagittal image of a right foot acquired with a 3D FEMR sequence.

As a natural application of the 0°–90° schedule, water and fat images with $T_2$-like weighting can be simultaneously and rapidly obtained. At 1.5 T, the optimal repetition time for such a sequence of 2.2 ms, which separates the centers of the passband and stopband of the, off-resonance profile by 220 Hz. The fat and water images are perfectly registered since their phase encode acquisitions are interleaved. Thus, the fat image can be used to form a mask to suppress the display of the remaining fat in the predominantly-water image (FIG. 25). FIG. 25 shows axial and coronal images from a 3DFT knee scan using 0°–90° FEMR and a 0.6 fractional echo. The left images show predominantly fat, while the simultaneously acquired middle images are mainly water. The right images are water images masked with the fat images, and show very minimal fat. Synovial fluid and cartilage have high and intermediate signal intensities, respectively, on water images, whereas bone marrow and subcutaneous fat are bright in the lipid images. A total imaging time for 28×14×14 $cm^3$ FOV with 1.1 mm isotropic resolution of 84 seconds yields both lipid and water images. Specifically, all pixels in the water image corresponding to the high intensity pixels in the fat image are set to zero. Though this technique may introduce artifacts when voxels contain both water and lipid spins, it may be used to advantage in applications involving maximum intensity projections, such as MR angiography. Subtracting the fat and water images is an alternative. A fast 3D technique with fat suppression and bright synovial fluid is ideal for musculoskeletal applications, especially for rapid survey of large volumes. FIGS. 25 and 26 show just two examples. FIG. 26 shows cropped sagittal image of the right foot acquired with a 3D FEMR sequence: 1.1 mm isotropic resolution. The rapid scan time (84 seconds) for these images compares favorably with conventional 3D techniques.

Figure 27:
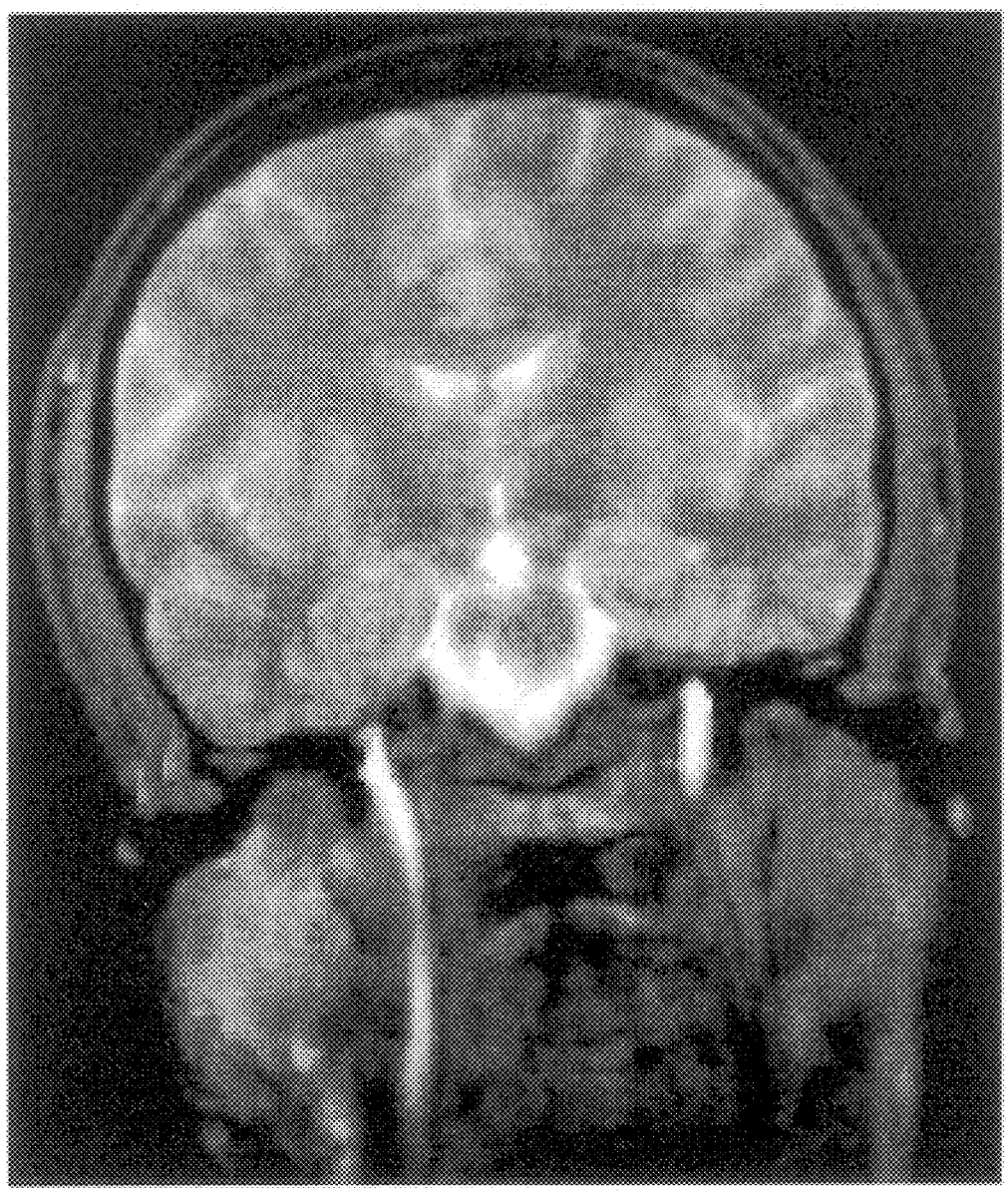
FIG. 27 illustrates a coronal slice of a brain obtained using a 3DFT FEMR sequence.
Figure 28:
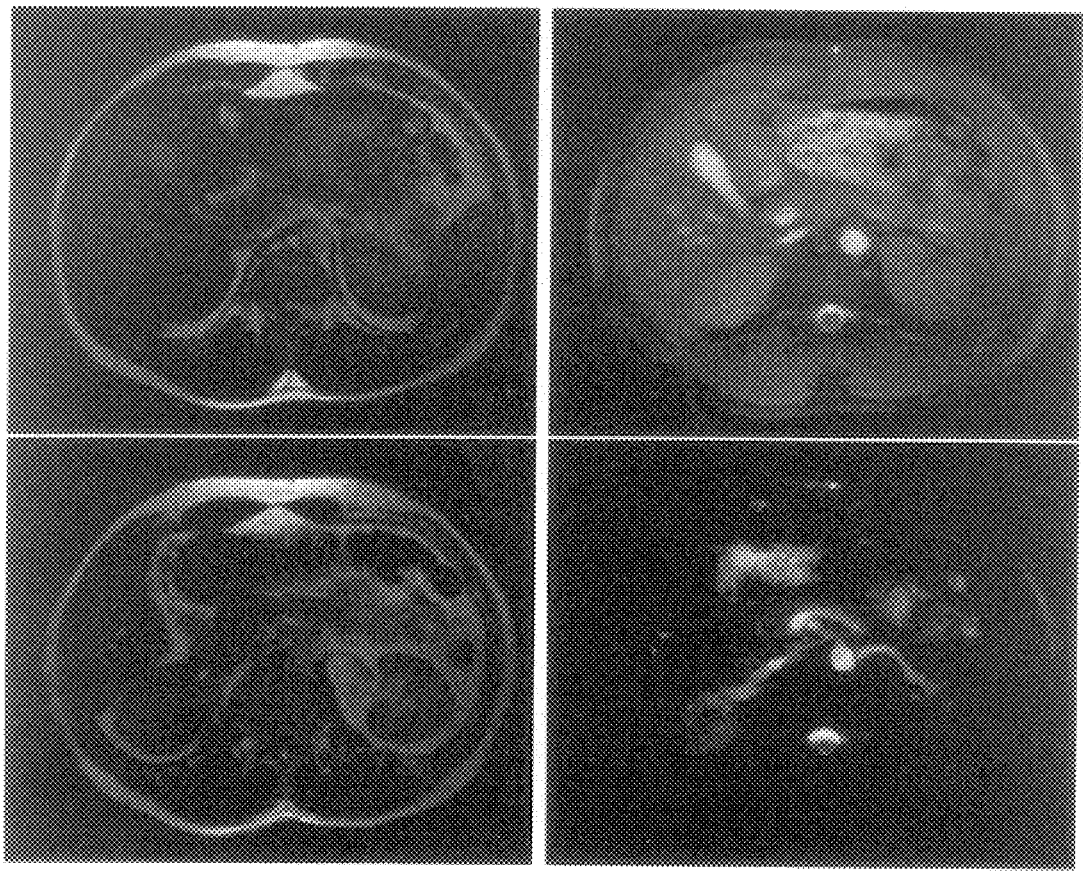
FIG. 28 illustrates cropped axial fat and water images obtained with a 2DFT FEMR scan of the liver.

Another application of FEMR is fast brain imaging, with $T_2$-like weighting for grey/white matter discrimination and assessment of ventricles. In under three minutes, the entire head is imaged at 1.1×1.1×2 $mm^3$ resolution with high SNR and bright cerebrospinal fluid (FIG. 27). FIG. 27 shows coronal slice of the brain obtained with a 3DFT FEMR sequence with 26° flip angle, TR=2.52 ms, and 0–90 phase cycle. Note the grey/white contrast, bright CSF signal, and delineation of the internal carotid arteries. The entire scan, covering 28×28×28 $cm^3$ with 1.1×1.1×2 $mm^3$ resolution, takes 2:45. No shimming was performed, and white matter has a SNR of 37, and grey matter 43. A fractional echo of 0.6 was used without homodyne detection. Similarly, abdominal imaging benefits from a fat-differentiated, high-SNR sequence fast enough to permit coverage of large anatomic regions within typical breathhold times (FIG. 28). FIG. 28 shows cropped axial fat (left) and water (right) images obtained with a 2DFT FEMR scan of the liver: 36×36 cm$^2$ FOV with 1.4×1.4 mm$^2$ resolution and 1 cm slice thickness; 45° SLR excitation pulse, 0.6 fractional echo, and torso phased array were employed. The bottom water image is windowed to emphasize the renal artery. Seven slices were obtained in eleven seconds with breathing suspended. Because the method sequentially acquires slices, sensitivity to suboptimal breath-holding is minimal, and no motion artifacts were discerned. Additionally, since the method can be used as a 2D sequence with sequential acquisition of image slices, resumption of breathing towards the end of the scan only corrupts the final few images, as compared with sequences such as FSE. A 3D implementation is also possible.

Figure 29:
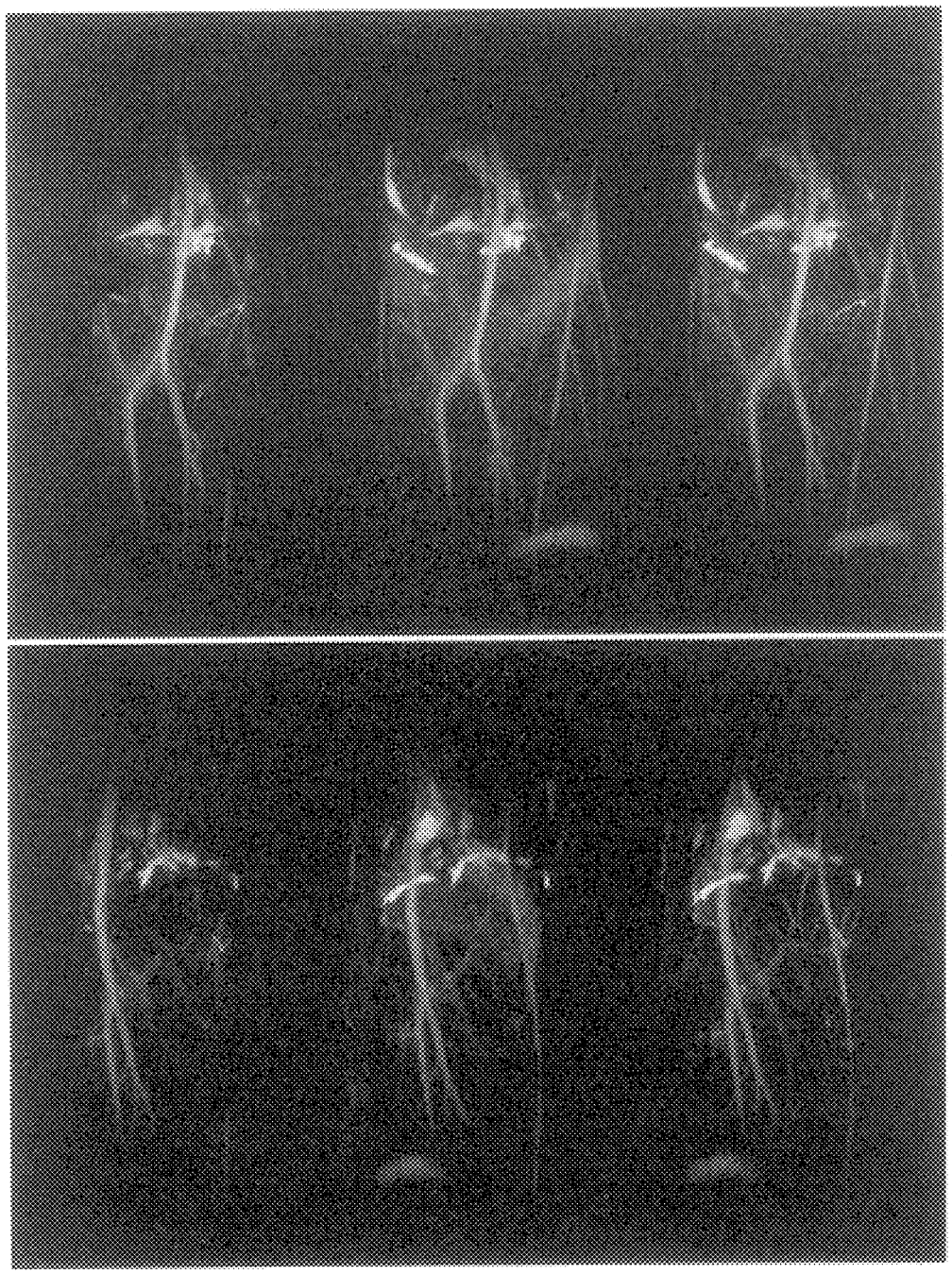
FIG. 29 illustrates maximum intensity projections (MIP) of popliteal region using a 3DFT FEMR sequence.

Since the arterial blood $T_2$ relaxation of 220 ms (10) is relatively long compared with that of muscle, connective tissue and venous blood (35 ms, 35 ms, and 100 ms, respectively), a novel time of flow-independent angiography is possible with FEMR. A large three dimensional volume can be rapidly imaged at high resolution, without the expense, morbidity, and botherment of administering a contrast agent. FIG. 29 shows the feasibility of this method. FIG. 29 shows maximum intensity projections (MIP) of popliteal region. Images were obtained with a 3DFT FEMR sequence with TR=2.52 ms, 26° flip angle, giving 1.1 mm isotropic resolution over 28×14×14 cm$^3$ FOV in 84 seconds. The top images show a projection from one viewing angle and the bottom images another. The left images are targeted MIPs of images with fat masking, so some superficial vessels and synovial fluid are eliminated. The middle images have no postprocessing, while the right images only have fat masking. Since lipid images with high SNR are also obtained, atherosclerotic plaque studies may also be possible. Because free precession sequences maintain transverse coherences, species with long $T_2$ or $T^*_2$ yield high signal. Thus the method described herein is ideal for imaging blood (angiography, FIG. 29), biliary fluid (cholangiography), cerebrospinal fluid (myelography), and joint fluid (FIG. 25). Also, oxygenation measurement and functional MRI can benefit. Fluoroscopic MRI in general, and cardiac fluoroscopy in particular, can take advantage of the method's high speed and signal.

Conventional methods of fat suppression, such as chemically selective saturation (CHESS), require large unrefocused gradients, and are thus incompatible with any refocused imaging sequence. Additionally, achieving fat suppression with a lengthy spectral-spatial excitation in a refocused imaging sequence would present severe banding artifacts since the long excitation pulse enforces a long repetition time; moreover, the data acquisition duty cycle suffers. Similarly, inversion nulling of lipid is incompatible with the desired steady-state signal from water protons.

Diagnostic situations requiring $T_2$ weighting and fat suppression are amenable to the method described in this paper, i.e., abdominal, pelvic, and breast MRI. For example, hepatic lesion detection requires $T_2$-weighted imaging with echo times greater than 80 ms, and lesion characterization necessitates echo times in excess of 120 ms. Additionally, the concomitant lipid image may prove particularly useful, as in discrimination between focal sparing in diffuse fatty metamorphosis of the liver and neoplastic involvement. Similarly, comparison of lipid and water images may permit assessment of microscopic and macroscopic fat in adrenal lesions, and hence discrimination of adrenal adenomas from malignancies, as in phase-contrast imaging.

Figure 30:
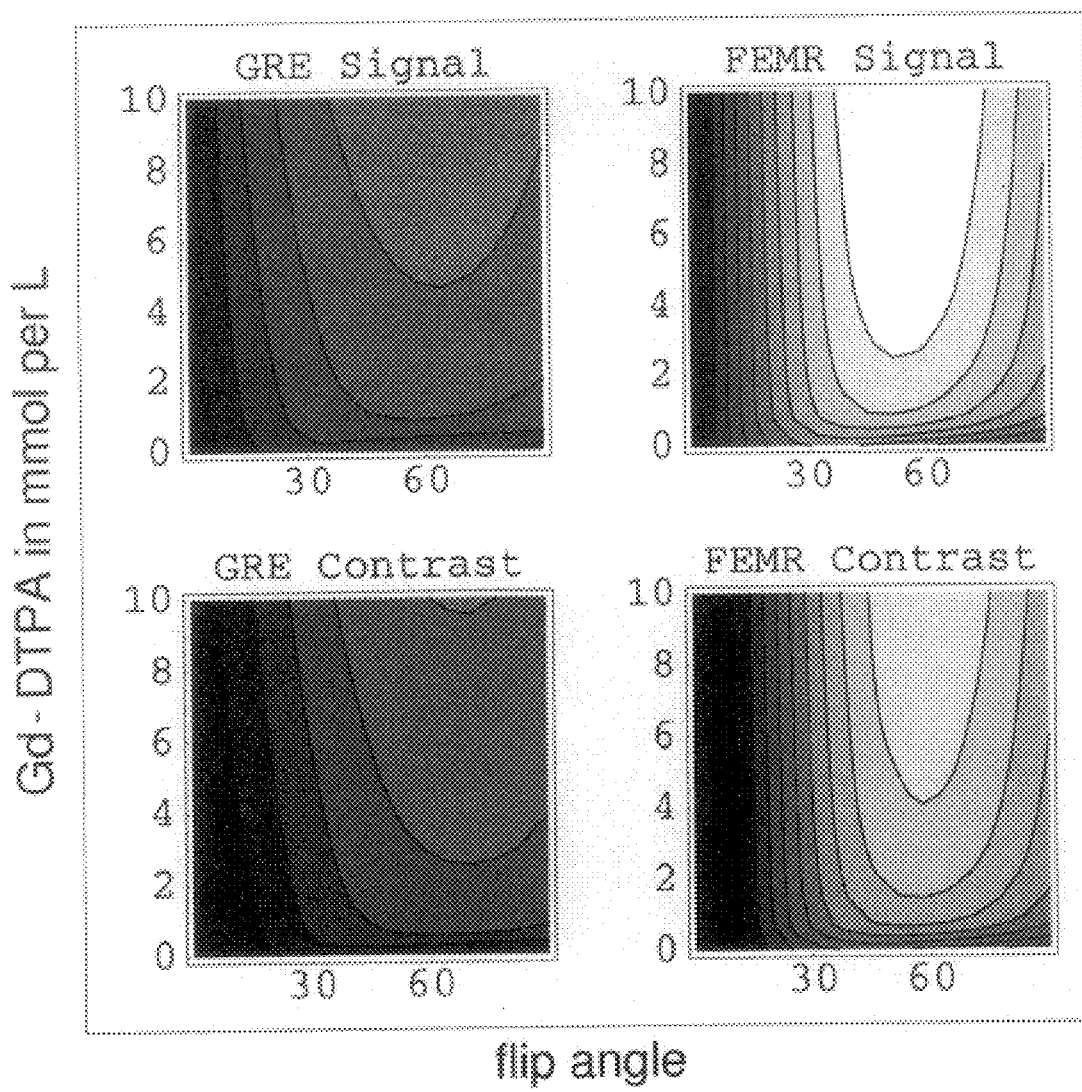
FIG. 30 illustrates signal and contrast from blood vessels with Gd-DTPA against muscle.

Additionally, species with a relatively high $T_2/T_1$ ratio yield high signal. Thus, contrast-enhanced angiography is possible with this fast imaging method. Because angiograms can be obtained without contrast (FIG. 29), very low doses of gadolinium may be employed to further improve vessel contrast, permitting imaging at multiple stations without exceeding dosing guidelines. FIG. 30 shows predicted signal and contrast achieved with Gd-DTPA using FEMR and a gradient-recalled steady-state sequence that rewinds phase encoding gradients. For a given concentration of contrast agent c with relaxivities $R_1$ and $R_2$, enhanced relaxation times, $T'_1$ and $T'_2$, for a species with $T_1$ and $T_2$ are given by $$\frac{1}{T'_1} = \frac{1}{T_1} + cR_1 \qquad \frac{1}{T'_2} = \frac{1}{T_2} + cR_2$$

For Gd-DTPA, $R_1$=4.5 mmol L$^{-1}$s$^{-1}$ and $R_2$=6.0 mmol L$^{-1}$ s$^{-1}$ are the relaxivities. The equilibrium magnetization for a FEMR sequence is given in the appendix, while the transverse magnetization for a gradient recalled steady state sequence with flip angle β, according to Sekihara (Steady-state magnetizations in rapid NMR imaging using small flip angles and short repetition intervals. *IEEE Trans. Med. Imaging* 6, 157–164 (1987)), is $$\underline{M_y} = \frac{M_0 \sin\beta}{1+\cos\underline{\beta}}\left(-1 - \frac{(e^{-TR/T_1} - \cos\beta)\sqrt{1 - e^{-2TR/T_2}}}{\sqrt{(1-e^{-TR/T_1}\cos\beta)^2 - (e^{-TR/T_1} - \cos\underline{\beta})^2 e^{-2TR/T_2}}}\right)$$

Studies of contrast agent uptake kinetics are becoming more common in brain, breast, and abdominal imnaging; optimal use requires rapid injection and imaging, since equilibrium between intravascular and interstitial spaces can be quick. Alternatively, fast $T_2$-weighted imaging with $T_2$ shortening agents, such as superparamagnetic iron oxide may be useful.

Besides proton MRI, phosphorus MRI, with intrinsically lower sensitivity, may benefit since inorganic phosphorus and phosphocreatine are two species with relatively long $T_1$ and $T_2$ relaxation times. In particular, these two species are analogous to lipid and water protons: their chemical shifts permit creation of separate images. Since phosphorus has a smaller gyromagnetic ratio by a factor of three, the repetition time may be prolonged by a factor of three, permitting longer data acquisitions, and hence, greater SNR.

The sequence is compatible with a number of readout strategies, including but not limited to, 2DFT, 3DFT, spirals, stack of spirals, and echo planar. However, fast gradient sets are a prerequisite, and though such systems are becoming more common and constantly improving, an alternative approach employing lower field strength has been advocated recently by Duerk et al. For example, the optimal repetition time for water/lipid discrimination at 0.5 T is 6.6 ms, compared with 2.2 ms at 1.5 T. Besides preventing gradient hardware damage, another concern when using FEMR is RF power deposition. Since a rapid series of brief, high-amplitude RF pulses is required, special attention must be given to avoid surpassing SAR limitations.

Hence, FEMR is a novel, fast, high-signal, noninvasive imaging technique. With a fluctuating equilibrium magnetization, several images, each with different contrast, can be acquired simultaneously. Flexible control of the relative $T_2$ contribution to contrast in images is achieved by varying the flip angle of RF excitation. Though very simple in concept and implementation, it addresses the important problem of incorporating water-lipid discrimination into fast, high SNR refocused techniques.

Figure 31A:
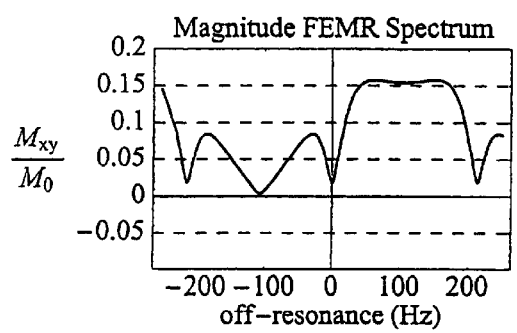
FIGS. 31A, 31B illustrate magnitude spectral response and real signal for a 0–90 FEMR sequence.
Figure 31B:
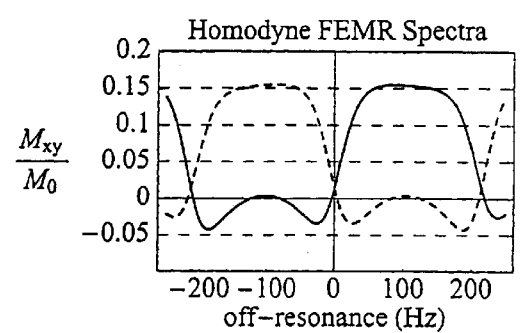
Figure 32A:
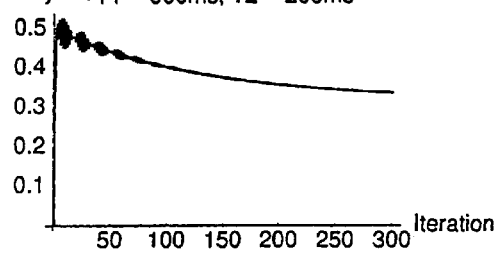
FIGS. 32A, 32B illustrate time evolution of $M_{xy}$ from excitation with a 0–90 excitation sequence.
Figure 32B:
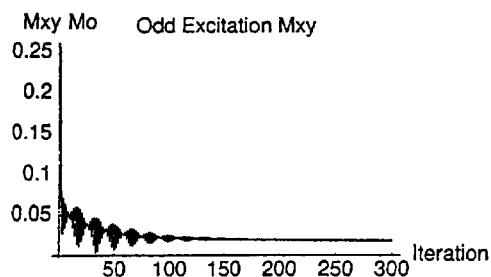

Consider now four additional novel features of FEMR and a novel modificaiton of SSFP. The first feature of FEMR provides improved lipid/water contrast by virtue of homodyne detection, as depicted in FIGS. 31A and 31B. The second entails employing a smaller tip angle for the first two excitations of a FEMR sequence to achieve equilibrium magnetization faster, best appreciated by comparing FIGS. 32A and 32B with FIG. 20A.

The third FEMR modification is an omission of gradient pulses during either the odd or the even repetition intervals, i.e., only one image is acquired. This omission reduces gradient heating, permitting use of the method on lower performance gradient systems.

Figure 33A:
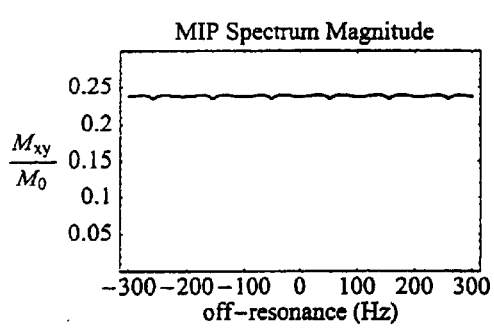
FIGS. 33A, 33B illustrate spectral response for 0-0-0-180 SSFP imaging.
Figure 33B:
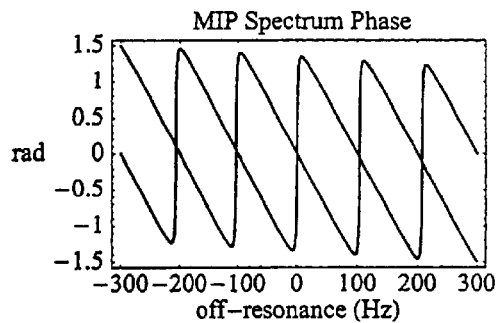

The SSFP modification is a method of eliminating banding artifacts. Specifically, complete Fourier datasets from multiple SSFP sequences with different RF phase cycles are acquired, an image from each dataset is reconstructed, and then a composite image is created in which every pixel has intensity that is the maximum of intensity of the corresponding pixels in the original SSFP images. FIGS. 33A and 33B show the spectral response of this method using a 0–0 and 0–180 phase cycle SSFP sequences. We call this method spectral maximum intensity projection SSFP (SMIPSSFP). SMIPSSFP achieves the same goal of banding-artifact free SSFP imaging as four-phase imaging, but with potentially half the scan time. However, unlike four-phase imaging, the repetition time must be short enough to prevent intravoxel signal cancellation from phase variation of the SSFP sequence.

Additionally, a hybrid of the FEMR and LCSSFP can be realized. First, we collect multiple datasets using a sequence with an RF phase cycle to produce a fluctuating equilibrium magnetization, just as in FEMR. Then, as in FEMR, we parse data corresponding to each member of the RF phase cycle to form multiple complete Fourier datasets, each corresponding to a member of the RF phase cycle. However, instead of directly reconstructing images corresponding to each member of the RF phase cycle, the datasets can be combined, as in LCSSFP, and then images are reconstructed.

While the invention has been described with reference to specific embodiments, the description is illustrative of the invention and is not to be construed as limiting the invention. Various applications and modifications may occur to those skilled in the art without departing from the true spirit and scope of the invention as defined by the appended claims.

What is claimed is:

1. A method of collecting image data with selective spectral suppression comprising the steps of:
   a) placing an object in a magnetic field
   b) acquiring two or more images by:
      i) applying a plurality of RF excitation pulses to the object at a sequence repetition rate, the phase of said RF pulses related by a fixed phase increment,
      ii) applying magnetic gradients between said RF excitation pulses;
      iii) acquiring NMR signals during the time said magnetic gradients are applied,
      iv) combining the NMR signals to produce an image where said phase increment is 360*(k−1)/N for the kth image out of a set of N images,
   c) computing the N point discrete Fourier transform for each pixel in the set of images to form Fourier transformed images,
   d) applying complex weighting to said Fourier transformed images,
   e) combining at least two of said weighted Fourier transformed images to produce an image with selective spectral suppression.

2. The method as defined by claim 1, where the integral of the magnetic gradients is zero between the RF pulses.

3. The method as defined by claim 2, where step b)i) includes applying magnetic gradients during the RF pulses, whereby the NMR signals are restricted to a slice.

4. The method as defined by claim 3, where step d) suppresses signals from lipid spins.

5. The method of claim 3, where two images are collected.

6. The method as defined in claim 5, where said RF phase increments are 0 degrees and 180 degrees.

7. The method as defined in claim 6, where said complex weighting are 1 and sqrt(−1).

8. The method as defined in claim 3, where four images are collected.

9. The method as defined in claim 8, where said phase increments are 0, 90, 180, and 270 degrees.

10. A method of collecting image data with selective spectral suppression comprising the steps of:
    a) placing an object in a magnetic field,
    b) repeatedly applying a sequence of two or more RF excitation pulses to the object at a repetition rate, whereby a repeated sequence of two or more substantially different spectrally selective steady state magnetizations are established,
    c) applying magnetic gradients between said RF pulses,
    d) acquiring NMR signals during the time said magnetic gradients are applied,
    e) combining said signals to produce an image with selective spectral suppression.

11. The method as defined by claim 10, where the integral of the magnetic gradients is zero between the RF pulses.

12. The method as defined in claim 11, where a magnetic gradient is applied during said RF pulses, whereby the NMR signals are restricted to a slice.

13. The method as defined in claim 12, where said RF excitation pulses alternate between two phases.

14. The method as defined in claim 13, where said RF phases are 0 and 90 degrees.

15. The method as defined in claim 14, where the RF repetition rate is half of the water-fat difference frequency.

16. The method as in claim 15, where one steady state signal is primarily from water spins, and the second steady state signal is primarily from lipid spins.

17. A method of collecting image data with selective spectral suppression using steady-state free precession magnetic resonance imaging comprising the steps of:
    a) placing an object in a magnetic field,
    b) applying time varying magnetic gradients along three axes to the object,
    c) applying a plurality of RF excitation pulses to the object at a sequence repetition rate, the phase of the RF pulses being related by a fixed phase increment and the repetition rate being selected to suppress nuclei spins within a selected spectral range,
    d) obtaining multiple datasets after applying multiple RF excitation pulses,
    e) computing discrete Fourier transformed data sets for each pixel in the multiple data sets,
    f) applying complex weighting to the Fourier transformed data sets, and g) combining the weighted Fourier transformed data sets to produce a data set with selective spectral suppression.

18. The method as defined by claim 17 wherein step d) includes spin rephasing after obtaining each acquisition using refocusing gradients along the three axes.

19. The method as defined by claim 18 wherein flip angles for the RF excitation pulses are chosen to obtain a desired passband and stopband.

20. The method as defined by claim 19 wherein large flip angles yield large passbands and narrow stopbands, and smaller flip angles produce narrower passbands and wider stopbands.

21. The method as defined by claim 20 wherein step c) suppresses lipid spins.

22. The method as defined by claim 18 wherein phase of the plurality of RF excitation pulses is varied and the multiple datasets are selectively combined to obtain a desired spectral profile.

23. The method as defined by claim 22 wherein the plurality of RF excitation pulses are varied between two phases.

24. The method as defined by claim 23 wherein datasets are obtained with two sequences with RF excitation phase of 0–0 and 0–180.

25. The method as defined by claim 22 wherein the plurality of RF excitation pulses are varied between four phases.

26. The method as defined by claim 25 wherein datasets are obtained with the four phases with RF excitation phase being 0–0–0–0, 0–90–180–270, 0–180–0–180, and 0–270–180–90.

27. The method as defined by claim 22 wherein step d) includes spin rephasing using refocusing gradients along the three axes after obtaining each acquisition.

28. The method as defined by claim 27 wherein flip angles of the RF excitation pulses are chosen to obtain a desired passband and stopband.

29. The method as defined by claim 28 wherein larger flip angles yield larger passbands and narrower stopbands, and smaller flip angles produce narrower passbands and wider stopbands.

30. The method as defined by claim 17 wherein phase of the RF excitation pulses is varied for parsing of data to form multiple images.

31. Magnetic resonance imaging apparatus for collecting image data with selective spectral suppression using steady-state free precession magnetic resonance imaging comprising a) means for establishing a magnetic field through an object to be imaged, b) means for applying magnetic gradients along three axes through the object, c) means for applying a plurality of RF excitation pulses to the object at a sequence repetition rate, the repetition rate being selected to suppress nuclei spin within a spectral range, d) means for obtaining multiple datasets after applying multiple RF excitation pulses, and e) means for computing discrete Fourier transformed data sets for each pixel in the multiple data sets, f) applying complex weighting to the Fourier transformed data sets, and g) means for combining weighted Fourier transformed data sets to produce a data set with selective spectral suppression.

32. Apparatus as defined by claim 31 wherein the means for applying magnetic gradients includes means for applying spin rephasing using refocusing gradients along the three axes after obtaining each dataset.

33. Apparatus as defined by claim 32 wherein the means for applying a plurality of RF excitation pulses produce flip angles for the RF excitation pulses which are chosen to obtain a desired passband and stopband.

34. Apparatus as defined by claim 33 wherein the flip angles are chosen to suppress lipid spins.

35. Apparatus as defined by claim 31 wherein the means for applying a plurality of RF excitation pulses varies phase of the RF excitation pulses and the multiple datasets are selectively combined to obtain a desired spectral profile.

36. Apparatus as defined by claim 35 wherein the phases vary between two phases.

37. Apparatus as defined by claim 35 wherein phases are varied between four phases (0, 90, 180, 270) and the multiple datasets are selectively combined for the phases 0–0–0–0, 0–90–180–270, 0–180–0–180, and 0–270–180–90.

38. The method as defined by claim 1 wherein step d) includes use of homodyne detection of magnetic resonant signals.

39. The method as defined by claim 1 wherein step a) includes applying a contrast agent to the object.

40. The method as defined by claim 1 wherein step e) includes setting all bright pixels in one image (fat) to zero in another image (water).

41. The method as defined by claim 1 wherein step e) includes subtracting one image (fat) from another image (water).

* * * * *

UNITED STATES PATENT AND TRADEMARK OFFICE
CERTIFICATE OF CORRECTION

| | | |
|---|---|---|
| PATENT NO. | : 6,307,368 B1 | Page 1 of 1 |
| APPLICATION NO. | : 09/312025 | |
| DATED | : October 23, 2001 | |
| INVENTOR(S) | : Shreyas S. Vasanawala, John M. Pauly and Dwight G. Nishimura | |

It is certified that error appears in the above-identified patent and that said Letters Patent is hereby corrected as shown below:

In col. 2, line 27, after "method" insert --is provided--.

Signed and Sealed this

Nineteenth Day of February, 2008

JON W. DUDAS
*Director of the United States Patent and Trademark Office*